US 7,194,244 B2

(12) United States Patent
Akamine et al.

(10) Patent No.: US 7,194,244 B2
(45) Date of Patent: Mar. 20, 2007

(54) WIRELESS COMMUNICATION RECEIVER

(75) Inventors: Yukinori Akamine, Kokubunji (JP);
Hisayoshi Kajiwara, Kokubunji (JP);
Satoshi Tanaka, Kokubunji (JP);
Takashi Yano, Tokorozawa (JP);
Hirotake Ishii, Hachioji (JP); Akio Yamamoto, Hiratsuka (JP); Kazuaki Hori, Yokohama (JP); Kazuhiko Hikasa, Hamura (JP)

(73) Assignee: Renesas Technology Corporation, Tokyo (JP)

( * ) Notice: Subject to any disclaimer, the term of this patent is extended or adjusted under 35 U.S.C. 154(b) by 273 days.

(21) Appl. No.: 10/253,648

(22) Filed: Sep. 25, 2002

(65) Prior Publication Data

US 2003/0064696 A1 Apr. 3, 2003

(30) Foreign Application Priority Data

Sep. 28, 2001 (JP) ............................ P2001-300296

(51) Int. Cl.
*H04B 1/06* (2006.01)

(52) U.S. Cl. ............................. 455/250.1; 455/251.1; 455/63.1; 455/296; 455/283; 375/254; 375/345

(58) Field of Classification Search ............... 455/311, 455/234.2, 240.1–250.1, 239.1, 251.1, 253.2, 455/355, 138, 136, 127.2, 127.3, 63.1, 67.11, 455/504, 575.1, 550.1, 424, 425, 324, 307, 455/308, 303, 296, 283, 232.1, 234.1, 67.1, 455/226.1, 65, 66.1, 561, 456.5, 456.6; 330/254, 330/283, 133, 279, 310, 134, 69, 278, 51, 330/281, 282, 129, 285; 370/342; 375/345, 375/254, 260, 232, 348, 354, 357, 364, 368, 375/377, 371, 373, 376, 366, 263, 362, 136, 375/147
See application file for complete search history.

(56) References Cited

U.S. PATENT DOCUMENTS 3,153,203 A * 10/1964 Wilhelm et al. ............. 330/260
3,519,850 A *  7/1970 Smith ........................... 327/52

(Continued)

FOREIGN PATENT DOCUMENTS

JP            533857         12/1993

(Continued)

OTHER PUBLICATIONS

"A 22mA 3.7dB NF Direct Conversion Receiver for 3G WCDMA" in an ISSCC Digest of Technical Papers, Feb. 5-7, 2001, San Francisco, USA, pp. 284-285.

(Continued)

*Primary Examiner*—Edward F. Urban
*Assistant Examiner*—Charles Chow
(74) *Attorney, Agent, or Firm*—Mattingly, Stanger, Malur & Brundidge, P.C.

(57) ABSTRACT

A wireless communication receiver that is able to lessen the effect of noise that accompanies gain change by programmable gain amplifiers. The receiver includes an AGC controller which controls the timing at which the programmable gain amplifiers make gain change, using a terminal counter and a sequencer. The receiver prevents gain change noise signals during the reception of control signals and other signals that are susceptible to noise. By the timing control feature, the programmable gain amplifiers make gain change while reducing noise impact.

12 Claims, 24 Drawing Sheets

U.S. PATENT DOCUMENTS

| | | | |
|---|---|---|---|
| 5,216,384 A * | 6/1993 | Vanhecke | 330/279 |
| 5,768,698 A * | 6/1998 | Kinoshita | 455/273 |
| 6,498,926 B1 * | 12/2002 | Ciccarelli et al. | 455/240.1 |
| 6,498,927 B2 * | 12/2002 | Kang et al. | 455/245.2 |
| 2004/0108893 A1 * | 6/2004 | Cho et al. | 330/51 |
| 2004/0178850 A1 * | 9/2004 | Banba | 330/254 |
| 2004/0218576 A1 * | 11/2004 | Imagawa et al. | 370/342 |

FOREIGN PATENT DOCUMENTS

| | | |
|---|---|---|
| JP | 06244754 | 9/1994 |
| JP | 09074322 | 3/1997 |
| JP | 200136362 | 2/2001 |
| JP | 200136367 | 2/2001 |
| JP | 200144776 | 2/2001 |
| JP | 200153564 | 2/2001 |
| JP | 2001111523 | 4/2001 |
| JP | 2001-156566 * | 8/2001 |

OTHER PUBLICATIONS

M. Goldfarb et al, "Analog Baseband IC for use in Direct Conversion W-CDMA Receivers" in a 2000 IEEE Radio Frequency Integrated Circuits Symposium, pp. 79-89.

* cited by examiner

| SLOT FORMAT | DATA 1 μ sec | TPC μ sec | TFCI μ sec | DATA 2 μ sec | PILOT μ sec |
|---|---|---|---|---|---|
| 0 | 0.0 | 133.3 | 0.0 | 266.7 | 266.7 |
| 1 | 0.0 | 133.3 | 133.3 | 133.3 | 266.7 |
| 2 | 66.7 | 66.7 | 0.0 | 466.7 | 66.7 |
| 3 | 66.7 | 66.7 | 66.7 | 400.0 | 66.7 |
| 4 | 66.7 | 66.7 | 0.0 | 400.0 | 133.3 |
| 5 | 66.7 | 66.7 | 66.7 | 333.3 | 133.3 |
| 6 | 66.7 | 66.7 | 0.0 | 266.7 | 266.7 |
| 7 | 66.7 | 66.7 | 66.7 | 200.0 | 266.7 |
| 8 | 100.0 | 33.3 | 0.0 | 466.7 | 66.7 |
| 9 | 100.0 | 33.3 | 33.3 | 433.3 | 66.7 |
| 10 | 100.0 | 33.3 | 0.0 | 400.0 | 133.3 |
| 11 | 100.0 | 33.3 | 33.3 | 366.7 | 133.3 |
| 12 | 100.0 | 33.3 | 66.7 | 400.0 | 66.7 |
| 13 | 116.7 | 16.7 | 33.3 | 466.7 | 33.3 |
| 14 | 116.7 | 16.7 | 16.7 | 483.3 | 33.3 |
| 15 | 125.0 | 8.3 | 8.3 | 508.3 | 16.7 |
| 16 | 129.2 | 4.2 | 4.2 | 520.8 | 8.3 |

| ORDERS OF FILTER | | 3 | 4 | 5 | 6 | 7 | 8 | 9 | 10 |
|---|---|---|---|---|---|---|---|---|---|
| 33dB SUPPRESSION | BUTTER WORTH | 1.070 | 1.438 | 1.700 | 1.886 | 2.024 | 2.133 | 2.220 | 2.277 |
| | CHEBY-SHEV | 1.300 | 1.802 | 2.142 | 2.346 | 2.473 | 2.530 | 2.584 | |

CUT OFF FREQUENCY (MHz)

FIG. 18

| GAIN NUMBER | VOLTAGE GAIN | TOTAL dB | INPUT Vpp | PGA 1 dB | PGA 2 dB | PGA 3 dB | FGA dB |
|---|---|---|---|---|---|---|---|
| 0 | 0.0794328 | -22 | 3.15E+00 | -18 | -24 | 4 | 16 |
| 2 | 0.1 | -20 | 2.50E+00 | -18 | -18 | 0 | 16 |
| 4 | 0.1258925 | -18 | 1.99E+00 | -18 | -18 | 2 | 16 |
| 6 | 0.1584893 | -16 | 1.58E+00 | -18 | -18 | 4 | 16 |
| 8 | 0.1995262 | -14 | 1.25E+00 | -12 | -18 | 0 | 16 |
| 10 | 0.2511886 | -12 | 9.95E-01 | -12 | -18 | 2 | 16 |
| 12 | 0.3162278 | -10 | 7.91E-01 | -12 | -18 | 4 | 16 |
| 14 | 0.3981072 | -8 | 6.28E-01 | -12 | -12 | 0 | 16 |
| 16 | 0.5011872 | -6 | 4.99E-01 | -12 | -12 | 2 | 16 |
| 18 | 0.6309573 | -4 | 3.96E-01 | -12 | -12 | 4 | 16 |
| 20 | 0.7943282 | -2 | 3.15E-01 | -6 | -12 | 0 | 16 |
| 22 | 1 | 0 | 2.50E-01 | -6 | -12 | 2 | 16 |
| 24 | 1.2589254 | 2 | 1.99E-01 | -6 | -12 | 4 | 16 |
| 26 | 1.5848932 | 4 | 1.58E-01 | -6 | -6 | 0 | 16 |
| 28 | 1.9952623 | 6 | 1.25E-01 | -6 | -6 | 2 | 16 |
| 30 | 2.5118864 | 8 | 9.95E-02 | -6 | -6 | 4 | 16 |
| 32 | 3.1622777 | 10 | 7.91E-02 | 0 | -6 | 0 | 16 |
| 34 | 3.9810717 | 12 | 6.28E-02 | 0 | -6 | 2 | 16 |
| 36 | 5.0118723 | 14 | 4.99E-02 | 0 | -6 | 4 | 16 |
| 38 | 6.3095734 | 16 | 3.96E-02 | 0 | 0 | 0 | 16 |
| 40 | 7.9432823 | 18 | 3.15E-02 | 0 | 0 | 2 | 16 |
| 42 | 10 | 20 | 2.50E-02 | 0 | 0 | 4 | 16 |
| 44 | 12.589254 | 22 | 1.99E-02 | 6 | 0 | 0 | 16 |
| 46 | 15.848932 | 24 | 1.58E-02 | 6 | 0 | 2 | 16 |
| 48 | 19.952623 | 26 | 1.25E-02 | 6 | 0 | 4 | 16 |
| 50 | 25.118864 | 28 | 9.95E-03 | 6 | 6 | 0 | 16 |
| 52 | 31.622777 | 30 | 7.91E-03 | 6 | 6 | 2 | 16 |
| 54 | 39.810717 | 32 | 6.28E-03 | 6 | 6 | 4 | 16 |
| 56 | 50.118723 | 34 | 4.99E-03 | 12 | 6 | 0 | 16 |
| 58 | 63.095734 | 36 | 3.96E-03 | 12 | 6 | 2 | 16 |
| 60 | 79.432823 | 38 | 3.15E-03 | 12 | 6 | 4 | 16 |
| 62 | 100 | 40 | 2.50E-03 | 12 | 12 | 0 | 16 |
| 64 | 125.89254 | 42 | 1.99E-03 | 12 | 12 | 2 | 16 |
| 66 | 158.48932 | 44 | 1.58E-03 | 12 | 12 | 4 | 16 |
| 68 | 199.52623 | 46 | 1.25E-03 | 18 | 12 | 0 | 16 |
| 70 | 251.18864 | 48 | 9.95E-04 | 18 | 12 | 2 | 16 |
| 72 | 316.22777 | 50 | 7.91E-04 | 18 | 12 | 4 | 16 |
| 74 | 398.10717 | 52 | 6.28E-04 | 18 | 18 | 0 | 16 |
| 76 | 501.18723 | 54 | 4.99E-04 | 18 | 18 | 2 | 16 |
| 78 | 630.95734 | 56 | 3.96E-04 | 18 | 18 | 4 | 16 |
| 80 | 794.32823 | 58 | 3.15E-04 | 18 | 18 | 6 | 16 |
| 82 | 1000 | 60 | 2.50E-04 | 18 | 18 | 8 | 16 |
| 84 | 1258.9254 | 62 | 1.99E-04 | 18 | 18 | 10 | 16 |
| 86 | 1584.8932 | 64 | 1.58E-04 | 18 | 18 | 12 | 16 |
| 88 | 1995.2623 | 66 | 1.25E-04 | 18 | 18 | 14 | 16 |
| 90 | 2511.8864 | 68 | 9.95E-05 | 18 | 18 | 16 | 16 |
| 92 | 3162.2777 | 70 | 7.91E-05 | 18 | 18 | 18 | 16 |

| TRANSFER RATE | PROCESS GAIN |
|---|---|
| 12.2kbps | 21.07dB |
| 64kbps | 15.05dB |
| 144kbps | 12.04dB |
| 384kbps | 9.03dB |

|  | GAIN (dB) | NF (dB) |
|---|---|---|
| SW | −0.5 | 0.5 |
| DPX | −2.5 | 2.5 |
| LNA+MIX | 30 | 3.5 |

FIG. 24

| TRANSFER RATE | MIN. RECEIVER SENSIBILITY | MAX. INPUT | PROPAGATION CONDITIONS (STATIC) | | | |
|---|---|---|---|---|---|---|
| | 12.2kbps | 12.2kbps | 12.2kbps | 64kbps | 144kbps | 384kbps |
| BER, BLER | BER<$10^{-3}$ | BER<$10^{-3}$ | BER<$10^{-2}$ | BLER<$10^{-2}$ | BLER<$10^{-2}$ | BLER<$10^{-2}$ |
| REQUIRED SIR (AFTER REVERSE DIFFUSION) | 1.1dB | 1.1dB | 2.1dB | −0.5dB | −0.1dB | 0.9dB |

WIRELESS COMMUNICATION RECEIVER

BACKGROUND OF THE INVENTION

1. Field of the Invention

The present invention relates to a wireless communication receiver (which will be simply referred to as a "receiver" hereinafter) and, more particularly, to a direct conversion type receiver using programmable gain amplifiers by which gains are adjustable in steps and being able to suppress the effect of noise that accompanies gain change by the programmable gain amplifiers.

2. Description of the Related Art

One type of signals to be received by receivers for Wideband Code Division Multiple Access (W-CDMA), standardization of which is pursued by the 3rd Generation Partnership Project (3GPP), Dedicated Physical Channel signals (which will be referred to as DPCH signals hereinafter) are formatted in a recommended format which is shown in FIG. 2A.

The DPCH signals are transmitted and received in frames, each frame being 10 msec., and one frame is divided into 15 slots, each slot being 666 μsec. One slot contains two data signals Data 1 and Data 2 and three control signals TPC, TFCI, and Pilot.

The TPC (Transmit Power Control) signal is for controlling electric power of transmission to a base station. The TFCI (Transport Format Combination Indicator) signal is for identifying the format type per frame that differs, depending on the transfer rate. The pilot signal is for detecting a phase and keeping synchronization with a base station.

Powerful error correction using turbo codes or the like does not apply to these control signals. As measures to protect the signals, transmission power is adjusted so that the power of the control signals only can be increased. One slot is composed of Data 1, TPC, TFCI, Data2, and Pilot parts which are sequenced in this order and time to be taken to receive these signals differs, depending on what slot format being received.

As methods of frequency conversion from a Radio Frequency (RF) band to a baseband in a receiver application, superheterodyne and direct downconversion are generally known.

Superheterodyne is a frequency conversion method in which the frequency of received signals in an RF band is downconverted twice to a baseband. That is, the frequency of received signals is first converted from the RF band to an intermediate frequency (IF) band and then converted to the baseband.

Direct conversion is a frequency conversion method in which the frequency of received signals is decreased to a baseband by downconverting the signals once.

As an example of receivers using direct conversion (which will be referred to as a "direct conversion receiver" hereinafter), we refer to "A 22 mA 3.7 dB NF Direct Conversion Receiver for 3G WCDMA" in an ISSCC Digest of Technical Papers, Feb. 5–7, 2001, San Francisco, USA, pp. 284–285.

The circuitry arrangement of this direct conversion received will now be described, using FIG. 3. Signals received from an antenna are amplified by a low noise amplifier 301 and distributed to two paths. In either path, the DC component of a signal is cut off by a capacitor 302 and its frequency is downconverted to a baseband by a mixer 303. During the downconversion, each mixer 303 multiples each of the two signals carried through the two paths by a local signal whose phase differs by 90 degrees for each signal, thereby generating one signal having a sine (sin) component and the other signal having a cosine (cos) component which intersect at right angles. A signal input at a terminal LOC is supplied as the local signal after passing through a Resistance Capacitance-Poly Phase (RC-PP) filter. Then, a low-pass filter 304 removes the adjacent channel signal power from the frequency-downconverted signal and outputs the signal with required gain. Next, a programmable gain amplifier 305 adjusts the gain of the signal so that its voltage level always falls within the dynamic range of an analog-to-digital (A/D) converter 306.

Moreover, as a document that focuses on the analog baseband portion of a direct conversion receiver, we refer to M. Goldfarb et al., "ANALOG BASEBAND IC FOR USE IN DIRECT CONVERSION W-CDMA RECEIVERS" in a 2000 IEEE Radio Frequency Integrated Circuits Symposium, pp. 79–89.

The receiving power of a mobile communications device varies, depending on the time when it receives and the place where it is. To maintain the voltage of received signals at a constant level when being input to the A/D converter, the programmable gain amplifier is necessary in the analog portion of the receiver. In the direct conversion, the programmable gain amplifier compensates for an insufficient gain unachievable by the low noise amplifier stage before the mixer or an excessively amplified gain. Because of a problem such as distortion by the mixer, the programmable gain amplifier is normally used at a stage behind the mixer.

Kokai (Japanese Unexamined Patent Publication) No. 2001-36362 discloses a programmable gain amplifier arrangement in receiver circuitry, in which cascode amplifiers and attenuators are assembled into it in order to extend the range of controllable gains.

Kokai No. 2001-36367, Kokai No. 2001-44776, and Kokai No. 2001-53564 disclose programmable gain amplifier arrangements including an attenuator circuit at the input stage thereof in order to suppress noise and distortion.

Moreover, as concerns how to control programmable gain amplifiers, Kokai No. 2001-111523 discloses controlling the timing at which a programmable gain amplifier by which gains are adjustable continuously starts gain control by means of calculation of received signal power. Kokai No. Hei-5-335857 (No. 335857 of 1993) discloses control causing programmable gain amplifiers to decrease the gain if synchronization is not attained.

SUMMARY OF THE INVENTION

For receivers using programmable gain amplifiers that implement gain change in discrete gains, that is, the programmable gain amplifiers by which gains are adjustable in steps, normally, noise with a low frequency spectrum component is produced by gain change. In such receivers including the above programmable gain amplifiers, after the RF frequency of received signals is downconverted to a baseband by direct conversion, noise intrudes into the frequency band of the signals with required gains when gain change takes place and this poses a problem.

In a transmission/reception method based on Time Division Multiple Access (TDMA) in which reception is intermitted for a period, if the programmable gain amplifiers make gain change during this period, the effect of the noise due to gain change done by the programmable gain amplifiers upon the received signals may not be taken into consideration and the above problem would be disregarded.

For a transmission/reception method based on Code Division Multiple Access (CDMA) in which reception is not intermitted, however, it is necessary to take some measures against the above problem.

It is an object of the present invention to provide a wireless communication receiver that is able to suppress the adverse effect of noise produced by gain change done by programmable gain amplifiers by which gains are adjustable in steps upon signals with required gains in application of direct conversion in a CDMA-based reception method without intermitting reception.

In order to achieve the foregoing object and in accordance with the present invention, a wireless communication receiver (which will be referred to as a "receiver" hereinafter) is provided that includes a first mixer for converting received signals to a predetermined baseband frequency by downconverting the signals once and a first programmable gain amplifier which is connected in series to the first mixer at the following stage and has a gain adjustment function that enables gain change in discrete gains. The wireless communication receiver is characterized by including noise reduction means for reducing noise that accompanies gain change in the discrete gains.

In the above receiver, the noise reduction means may be a timing control circuit which controls gain change timing or a noise suppression circuit which suppresses noise that accompanies gain change.

If the timing control circuit is applied, it is advisable to select a signal that is strong to noise impact by being error corrected when received and cause the programmable gain amplifier to make gain change at the timing of receiving that signal.

The reason why the noise reduction means should be provided to select a signal that is strong to noise impact by being error corrected when received and cause the programmable gain amplifier to make gain change is as follows.

When signals formatted in a predetermined frame structure are transmitted and received, control signals and other signals to which error correction does not apply often coexist with data in a frame. The control signals are liable to be affected by noise to a great extent and often include special and important information. If important signals to which error correction does not apply and signals that are error corrected and strong to noise both exist in a frame structure, and if the programmable gain amplifier can make gain change when the receiver is receiving a signal strong to noise in the frame structure, the effect of noise due to gain change can be lessened.

To implement such timing control, the receiver should include a device for synchronization and sending data at the beginning of a frame (a cell and path search section 108 in FIG. 1), a time-measuring device such as a counter that is able to measure time elapse from a certain point, and a device for getting and maintaining frame structure information (a sequencer 109 in FIG. 1). Which timing at which the programmable gain amplifier will make gain change should be controlled.

If the programmable gain amplifier always makes gain change at the same elapse time from the beginning of a frame, there is a possibility that an error always occur in the same type signal by noise accompanying gain change. In this case, it is advisable to exert control so that the programmable gain amplifier makes gain change at random timing.

If the above-mentioned latter noise suppression circuit is applied, it is advisable to configure the programmable gain amplifier itself so that noise accompanying gain change is hard to produce.

Specifically, a plurality stages of programmable gain amplifiers or amplifiers should be constructed and, in at least one of the amplifiers, the emitters of a first transistor and a second transistor which form a differential pair should be connected via a capacitor. For example, as in circuitry shown in FIG. 4, in a conventional programmable gain amplifier of a differential type, if the emitters of transistors forming a differential pair are connected via a capacitor, the DC component between the emitters of the differential pair, which is generated due to individually varying electrical characteristics of the transistor pair, can be eliminated, and noise accompanying gain change becomes hard to produce.

In the circuitry of FIG. 4, two capacitors need to be attached to differential lines in the output section in order to eliminate the DC component of the output. If the capacitors that are so large that they cannot be mounted on an IC chip are required, it is desirable to attach an external capacitor out of the IC chip to one programmable gain amplifier. To enable this, the programmable gain amplifier should be constructed such that a plurality of first switches connected in parallel to the emitter of a first transistor which is one of the differential pair, a plurality of first resistors connected in series to the first switches, a plurality of second switches connected in parallel to the emitter of a second transistor, and a plurality of second resistors connected in series to the second switches are interconnected via one capacitor. In this circuitry, gain can be changed by disconnecting and reconnecting the resistors by the plurality of first and second switches.

However, if metal oxide semiconductor field effect transistors (which will be referred to as "MOSFETs" hereinafter) are used as the above switches, the effect of on-resistance presents a problem and the gate width of the MOSFETs need to increase. If these large MOSFETs are used, due to their parasitic capacitance, gain rises at a high frequency band. This gain rise can be avoided by connecting the collectors of the differential pair of transistors via a capacitor. This can produce the same effect that a low-pass filter is connected to the output.

By comparison between the above-described programmable gain amplifier circuitry in which the emitters of the transistors forming one differential pair are connected via a plurality of resistors and the plurality of resistors are connected and disconnected by the associated switches and the conventional programmable gain amplifier circuitry in which the transistors of a plurality of differential pairs are individually connected and disconnected, the effect of varying electrical characteristics of individual transistors can be lessened and, consequently, noise accompanying gain change can be reduced. In the case of a programmable gain amplifier that is comprised of multiple stages of differential pairs of transistors, to reduce the external capacitors required to cut off the DC at the output terminals of the differential pairs of transistors, it is effective to use the capacitor inserted between the emitters of each differential pair of transistors as well.

For a multistage configuration of programmable gain amplifiers, it is preferable to provide the first-stage programmable gain amplifier with hysteresis. This can reduce the frequency of gain change in the first stage. The frequency of gain change in the first stage where, particularly, a large noise is produced can be lessened and, consequently, the effect of noise due to gain change on received signals can be alleviated.

BRIEF DESCRIPTION OF THE DRAWINGS

FIG. 18 is a table of exemplary gains for W-CDMA.

FIG. 24 is a table listing experimentally obtained values of required SIR.

DETAILED DESCRIPTION OF THE PREFERRED EMBODIMENTS

Preferred embodiments of the present invention will now be described in detail with reference to the accompanying drawings.

<Embodiment 1>

Figure 1:
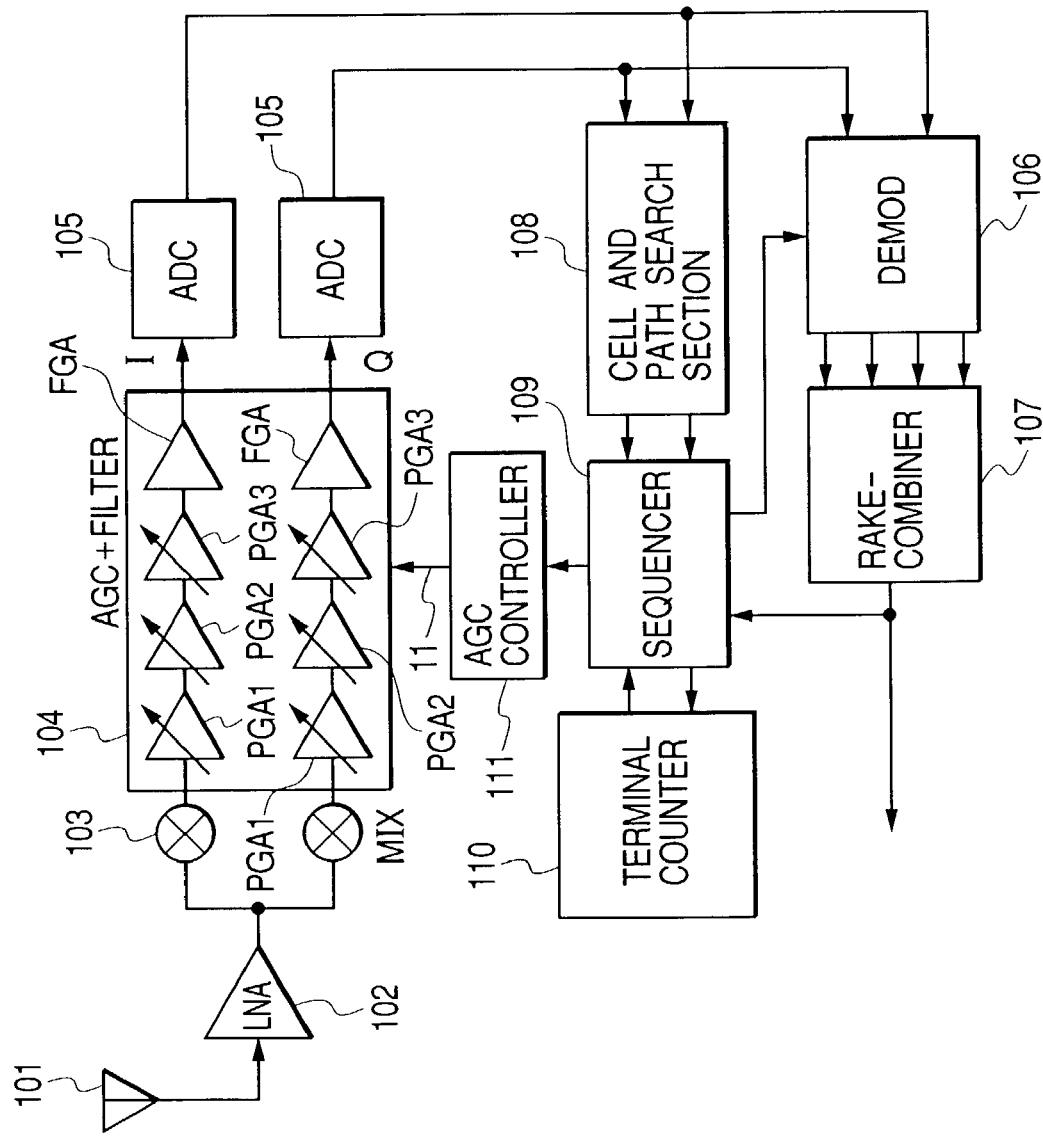
FIG. 1 is a circuitry block diagram showing a receiver configuration according to the present invention, illustrating a system architecture example of a direct conversion type receiver of the invention.

FIG. 1 is a circuitry block diagram showing a receiver configuration according to the present invention, illustrating a system architecture example of a direct conversion type receiver of the invention. In this receiver, processing with digital signals is performed in stages following the A–D conversion stage; signal processing such as demodulating modulated signals received and controlling the analog portion of the receiver is performed. A feature of the receiver configuration of FIG. 1 is that timing at which programmable gain amplifiers make gain change can be controlled.

In FIG. 1, reference numeral 101 denotes an antenna. Signals received by the antenna 101 is converted into electric signals and amplified by a low noise amplifier (LNA) 102. Then, mixers 103 downconvert the frequency of the signals to a baseband and a section 104 consisting of programmable gain amplifiers and filters cuts off frequencies out of the band of the channel and amplifies the signal voltage to required power. Next, A–D converters (ADCs) 105 convert the signals to digital signals that are then modulated by a demodulator (DEMOD) 106. A RAKE combiner 107 combines signal waves in a delay spread on multiple paths. A cell and path search section 108 detects slot synchronization at the start of speech or a data flow and sends a synchronization signal to a sequencer 109. An AGC controller 111 controls the timing at which the programmable gain amplifiers and filters section 104 makes gain adjustment and change.

The AGC controller uses a terminal counter 108 to control the timing at which the programmable gain amplifiers make gain change. When the cell and path search section 108 detects slot synchronization, it causes the terminal counter 110 to start via the sequencer 109. Then, the terminal counter 110 counts time elapse from the beginning of the slot format. At this time, the sequencer 109 must get information about the slot format because gain change timing differs, depending on which format the receiver is receiving.

In W-CDMA (Wideband-CDMA) communications, there is a possibility of format change per frame. In this case, to get information for format change, the sequencer 109 checks a sequence of received signals combined by the RAKE combiner 107 to find format change so that it can identify which slot is being received. The receiver configuration of FIG. 1 is effective especially for W-CDMA communications.

In the following, a noise generation mechanism when gain change occurs and the necessity of control of gain change timing in this embodiment will be explained, using FIGS. 2A, 2B, 4, 6, 7, 8A–8C, 17A, and 17B.

Figures 2A, 2B:
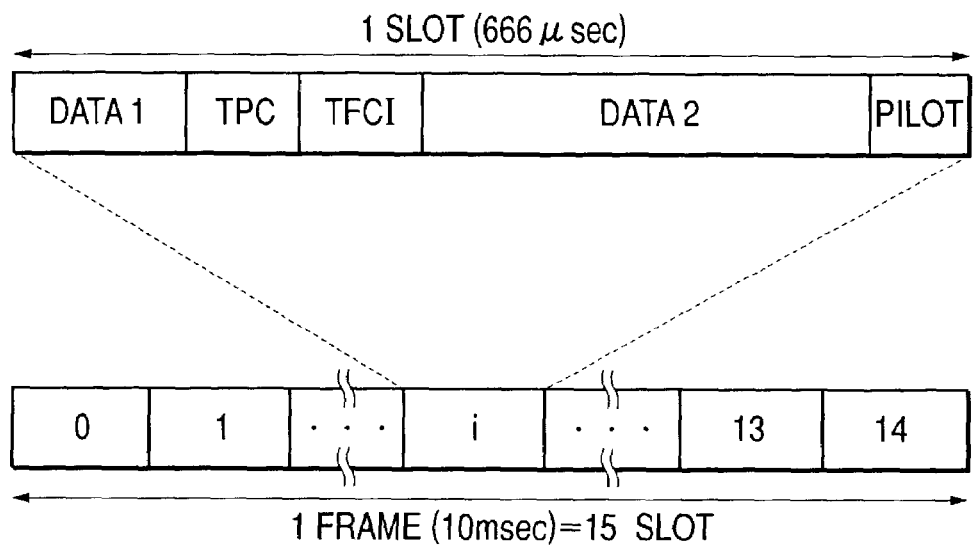
FIG. 2A shows the structure of a slot format for WCDMA.
FIG. 2B is a table listing time to be taken to receive the constituent parts of serial slots.
Figure 3:
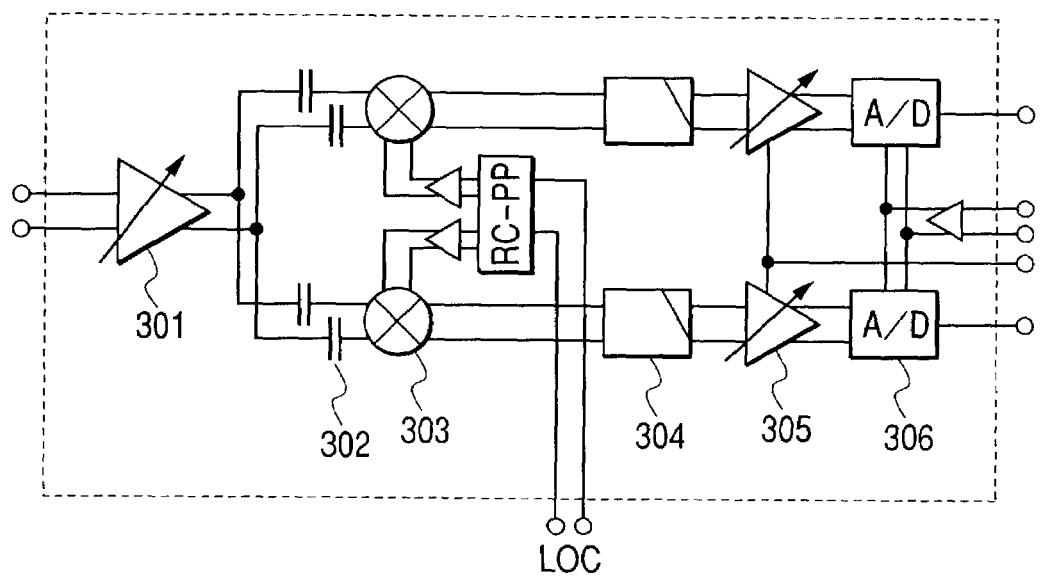
FIG. 3 is a block diagram representing a typical configuration of a direct conversion receiver of prior art.

The W-CDMA oriented 3GPP standards define the frame structure of downlink DPCH signals from a base station to a mobile terminal (receiver) as shown in FIG. 2A. One frame is divided into 15 slots; time to be taken to receive one slot is 666 μsec. In a slot, data signals Data 1 and Data 2, and TFCI, TPC, and Pilot control signals besides are transmitted. These control signals are not subjected to error correction. A table of FIG. 2B lists time to be taken to receive the above signals in serial slots and the time to be taken to receive the control signals differs, depending on what slot format being received.

It is possible that control of the programmable gain amplifiers is exerted such that gain change will occur at intervals of one slot to few frames.

Figure 4:
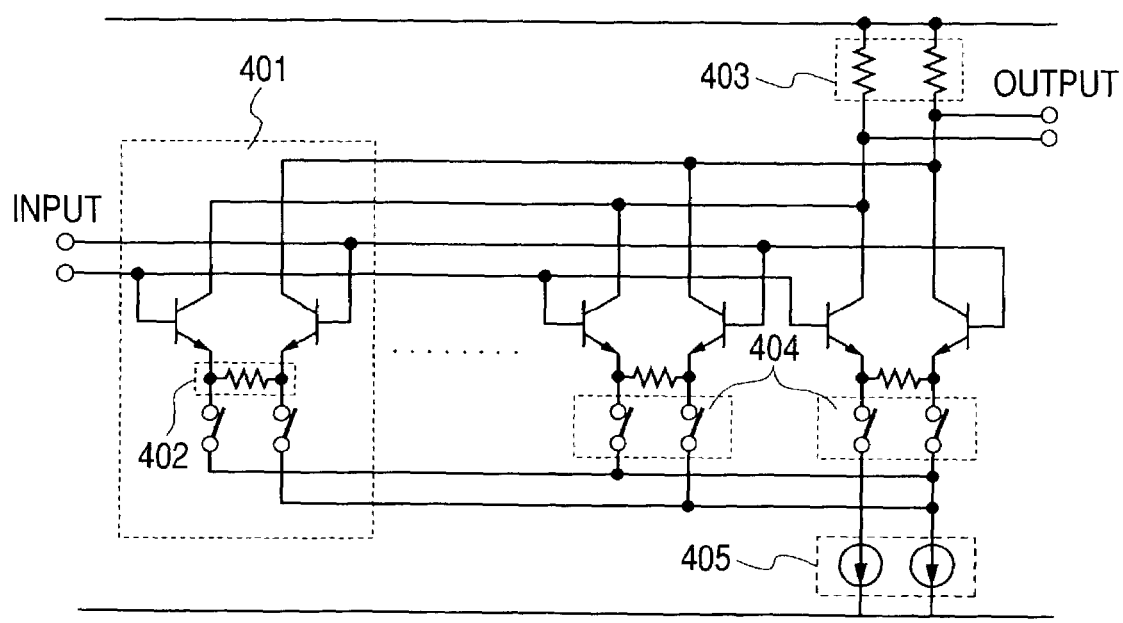
FIG. 4 is a circuitry diagram of a conventional programmable amplifier.

FIG. 4 shows circuitry of a conventional programmable gain amplifier with multiple stages of differential pairs, operating to adjust gains in steps. A plurality of transistor differential pairs 401 are connected each other in parallel. Emitter resistors 402 having different resistance are each inserted between each differential pair. To the collector ends of the transistors, a pair of collector resistors 403 is connected that is common for all differential pairs. The emitters of all differential pairs are connected via switches to current sources 405. By switching between connection of each differential pair to the current sources 405 and disconnection by each individual switch 404, the amplifier gain changes in steps.

In the circuitry of FIG. 4, the effect of voltage deviation ΔVBE between the base and emitter of a transistor pair forming each differential pair and other effects such as variation of the current amplification factors hFE of the differential pairs, and variation in resistance of the pair of collector resistors 403 cause a DC offset at the differential output. Gain change is made by switching from one differential pair to another differential pair and, at this time, another differential pair having individually varying electrical characteristics causes step change to a different DC offset. Therefore, at gain change, noise is induced by step up and down by difference between DC offsets before and after the gain change.

Figure 6:
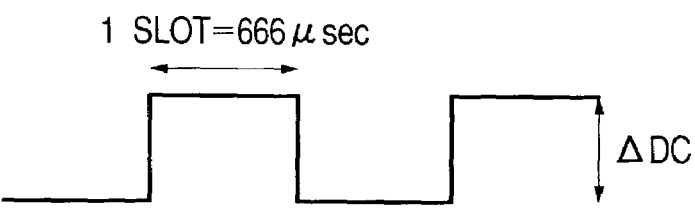
FIG. 6 shows a rectangular pulse corresponding to step up and down of DC offset before and after gain change.
Figure 7:
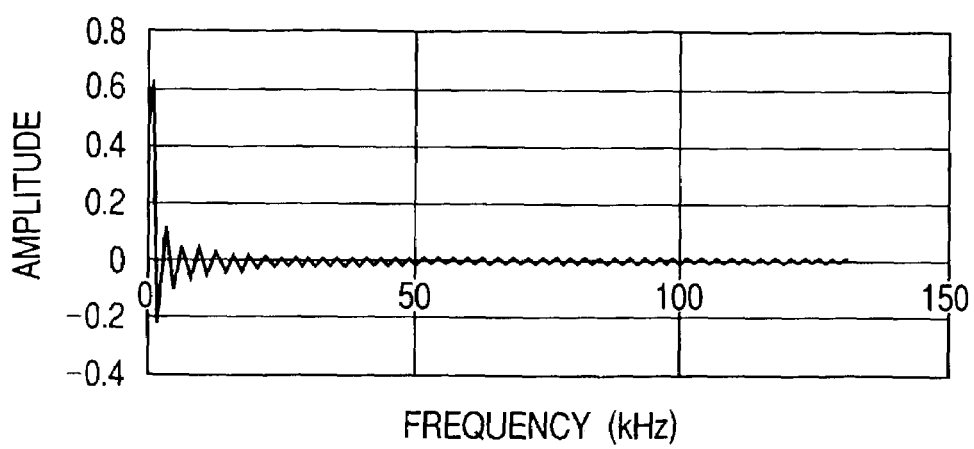
FIG. 7 shows the amplitude characteristic of noise induced by the rectangular pulse corresponding to step up and down of DC offset of FIG. 6.
Figure 8A:
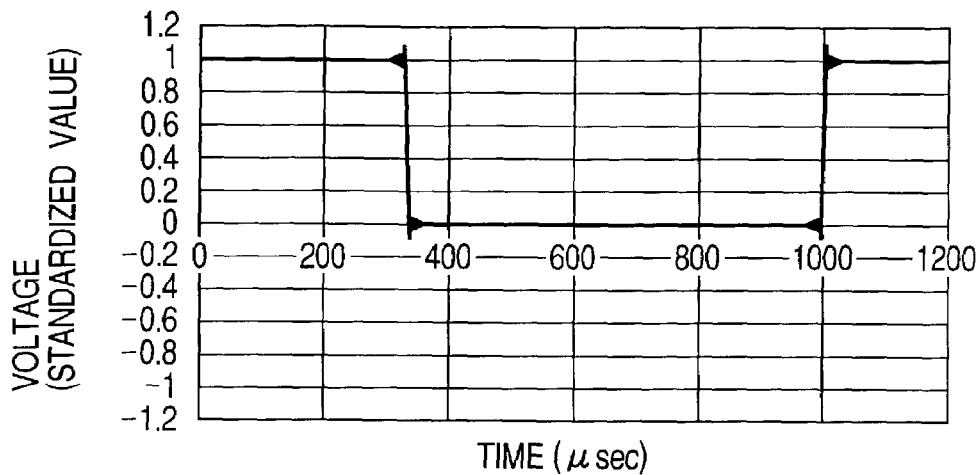
FIGS. 8A–8C show the pulse waveforms to be generated when gain change occurs.
Figure 8B:
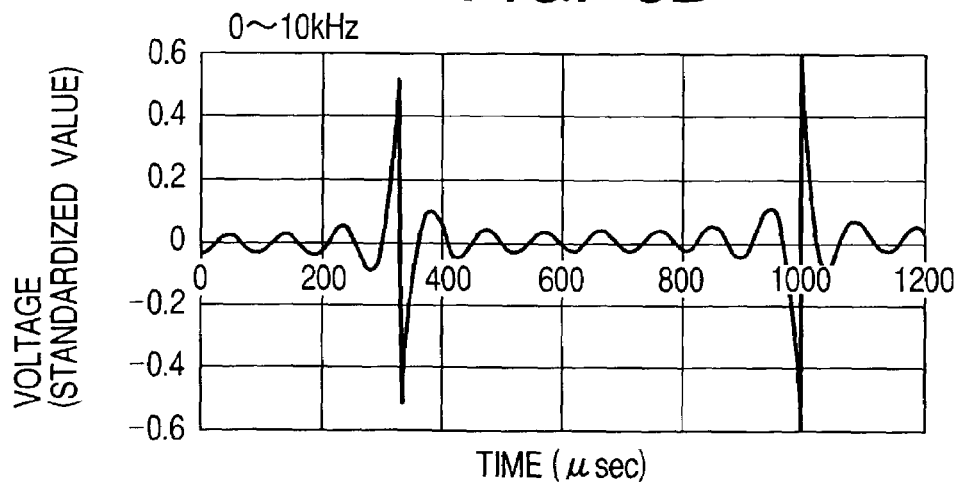
Figure 8C:
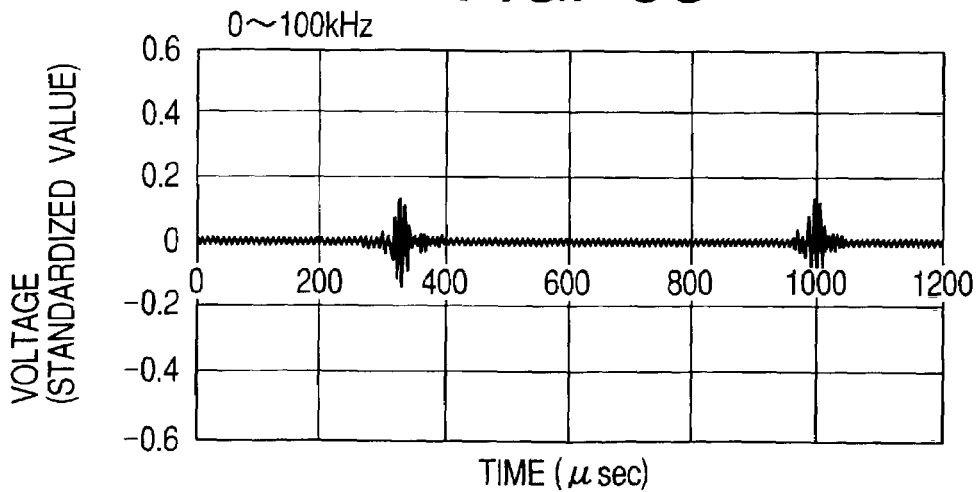

Now, assume that control of the programmable gain amplifier is exerted such that gain change will occur at intervals of one slot and switching between two differential pairs occurs at intervals of one slot. In this case, a rectangular pulse with a width of one slot period and a height of difference between DC offsets before and after gain change are generated as is shown in FIG. 6. The amplitude the rectangular pulse that steps up and down in one slot cycles changes in a zigzag line with frequency plotted on the abscissa as is shown in FIG. 7, where the amplitude is greater at lower frequency close to DC. FIG. 8A shows a waveform of the rectangular pulse that steps up and down between standardized values of voltage in one slot cycles over time on the abscissa, where noise appears at the rising and falling edges of the rectangular pulse. When a frequency band from the DC component to 10 kHz is completely cut off from this rectangular pulse by a high-pass filter (HPF), a resultant waveform is shown in FIG. 8B. When a frequency band from the DC component to 100 kHz component is completely cut off similarly, a resultant waveform is shown FIG. 8C. As is apparent from FIGS. 8B and 8C, the amplitude of the rectangular pulse decreases as the cut off frequency band becomes wider. As a result, noise intrudes into the signal at step change, according to the cut off frequency, as shown in FIGS. 8B and 8C.

In the case of W-CDMA, the bandwidth of the analog baseband is between 0 Hz and 1.92 MHz (Nyquist frequencies) Adjacent channel bandwidth is between 3.84 MHz and 6.92 MHz. For adjacent channel signals, a suppression or attenuation of 33 dB or above is required to satisfy the 3GPP standards. In W-CDMA received signals, the level of noise such as thermal noise and Additive White Gaussian Noise (AWGN) is usually greater than the signal level.

Figures 17A, 17B:
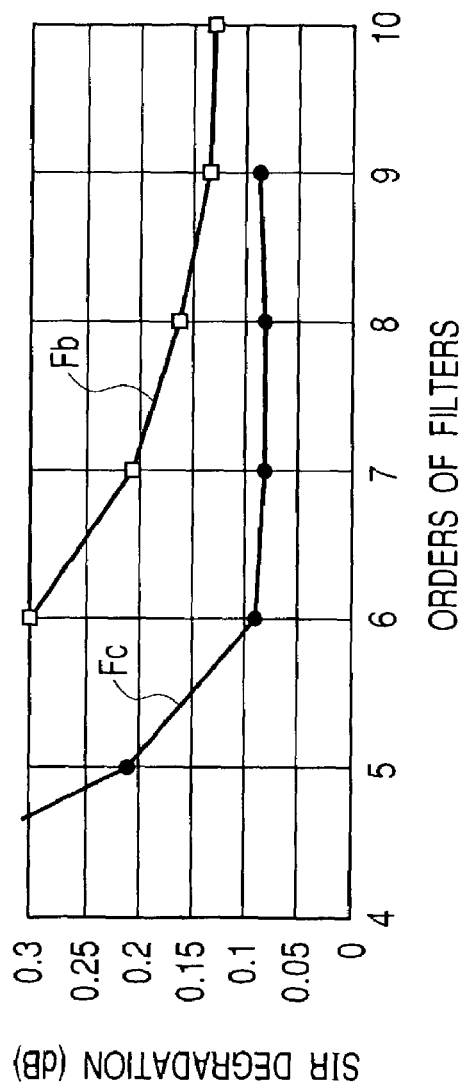
FIG. 17A is a graph for explaining SIR deterioration of channel filters for W-CDMA.
FIG. 17B is a table of cutoff frequencies according to the orders of the filters.

On the assumption hereof and taking a variation per element of 15% in the product of capacitance and resistance (CR product) into consideration, when degradation in decibels in a Signal to Interference Ratio (SIR) of channel filters of Butterworth and Chebyshev types for attenuating adjacent channels by 33 dB is calculated, characteristic lines are obtained as is shown in FIG. 17A. In FIG. 17A, Fb is a characteristic line of the Butterworth type filter and Fc is a characteristic line of the Chebyshev type filter. From this graph, a 6th order Chebyshev type filter with a degradation of 0.1 dB or below is considered suitable. As is shown in FIG. 17B, the cutoff frequency of the 6th order Chebyshev type filter is approximately 2.3 MHz and time to be taken for the rectangular pulse to rise by gain change made by the programmable gain amplifier is considered equivalent to a time constant of this filter. Thus, the rise time of the rectangular pulse would be shorter than 1 μsec.

As bandwidth to an extent that signal loss by the high-pass filter is tolerable, cutoff frequencies of about several tens of kilohertz are considered appropriate. For the high-pass filter, when decibels corresponding to SIR degradation are calculated similarly, the following results are obtained. When SIR degradation is, for example, 0.25 dB, the cutoff frequency (with a decrease of 3 dB) is 107 kHz for the 1st order high-pass filter, 58 kHz for the 2nd order one, and 43 kHz for the third order one. From these results, it turns out that several tens of microseconds that are a time constant of the high-pass filter are required before the rectangular pulse generated by gain change made by the programmable gain amplifier disappears.

From the above, the duration of noise intrusion into required signals due to gain change made by the programmable gain amplifier is considered a period of several tens of microseconds after the occurrence of gain change.

In contrast with several tens of microseconds, the time to be taken to receive a control signal is short in some slot formats as shown in FIG. 2B. If stepwise gain change coincides with receiving a control signal to which error correction does not apply, it would cause an error of the control signal. In that event, if the control signal is a TCP signal, the transmitting power is affected; if the control signal is a TFCI signal, the block error rate is affected. Both are essential to the operation of the mobile terminal. According to circumstances, fatal trouble would occur.

Meanwhile, data signals Data 1 and Data 2 mentioned in FIGS. 2A and 2B are strong to noise because powerful error correction such as turbo codes is arranged for data in the W-CDMA communications. Moreover, the data signals Data 1 and Data 2 occupy the most portion of a slot as shown in FIG. 2A. Therefore, when noise occurs in a data signal due to gain change made by the programmable gain amplifier, its adverse effect is smaller than when it occurs during the reception of a control signal.

Thus, the circuit to control the timing of gain change by the programmable gain amplifier needs to exert timing control so that gain change will take place during data signal reception.

Using illustrative examples and values, an intolerable degree of noise to be produced by gain change made by the programmable gain amplifier will be further explained with reference to FIGS. 4 and 18-27D.

First, let us consider how large DC offsets occur at switching between the differential pairs shown in FIG. 4. Considering that individually varying electrical characteristics of a transistor pair forming each differential pair cause DC offsets, probability distribution of how large DC offsets occur is regarded as a normalized distribution, that is, a normalized distribution within ±3 σ and ±5 mV, though somewhat more varying, depending on the transistor fabrication process to be applied. Note that the value of 5 mV is considered reasonable as equivalence to input of the programmable gain amplifier.

Gain change is made by switching from one differential pair to another differential pair. If the switched-to differential pair have individually varying electric characteristics independent of the switched-from differential pair, probability distribution of the difference (the height of a step) between the DC offsets to occur before and after the gain change would be also a normalized distribution. Its variance (the value of σ raised to the second power) can be expressed as the sum of variance of DC offsets before switching and variance of DC offsets after switching. That is, a step corresponding to the difference between the DC offsets before and after the gain change takes place and its height is obtained by summing square 5 mV and square 5 mV and raising the sum to the 0.5 power. Thus, about 7 mV is generated as the value of 3 σ. Again, note that the value of 7 mV is also equivalent to input of the programmable gain amplifier. Accordingly, a value of voltage must be calculated as equivalence to its output, considering gain change.

Figure 19A:
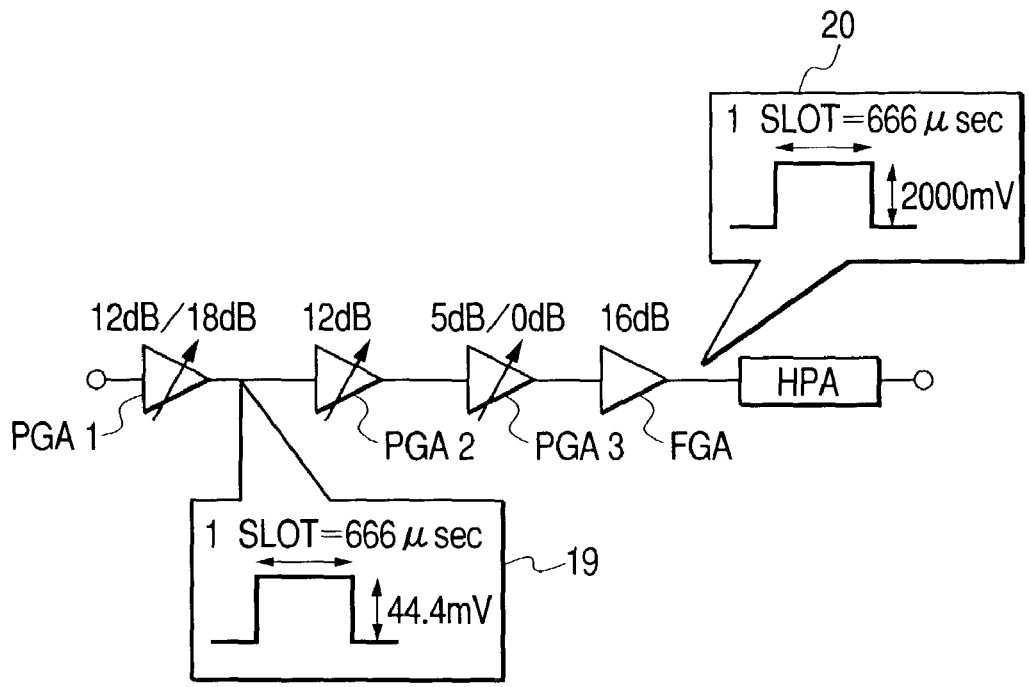
FIG. 19A shows programmable gain amplifier circuitry.

Then, how large noise occurs will be explained, using a table of actually obtained gains by programmable gain amplifiers and FIGS. 18, 19A, and 19B. A gain table which is shown in FIG. 18 is assumed containing exemplary gains. The gain values in this table are assumed obtained from circuitry consisting of three stages of programmable gain amplifiers (PGAs), PGA1, PGA2, and PGA3, and one stage of a fixed gain amplifier (FGA), as is shown in FIG. 19A.

In the gain table of FIG. 18, even numbers 0–92 are assigned to the obtained gains for space convenience because assignments of serial gain numbers to all gains extend the table. For each gain number, voltage gain, total gain (Total), first-stage input voltage (Input Vpp), and the respective gain outputs of PGA–PGA3 and FGA are specified. The range of gain numbers 6-86 corresponds to the scope of serviceability of the PGAs and gain number 0–4 and 88–92 are reserved as operation margins. PGA1 should be able to make gain change in 6-dB steps in the range of −18 to 18 dB. PGA2 should be able to make gain change in 6-dB steps in the range of −24 to 18 dB. PGA3 should be able to make gain change in 1-dB steps in the range of 0 to 18 dB. The FGA outputs 16 dB constantly.

Gain change from gain number 67 to 68 is accompanied by large noise. For gain number 67 which, however, is not shown, the gain outputs of PGA1, PGA2, and PGA3 are 12 dB, 12 dB, and 5 dB, respectively. Specifically, at the gain change from gain number 67 to 68, the gain output of PGA1 at the first stage changes from 12 to 18 dB, the gain output of PGA2 remains at 12 dB, and the gain output of PGA3 changes from 5 to 0 dB, as noted in FIG. 19A. In consequence, the total gain changes from 45 to 46 dB including the last-stage FGA. In a box marked by reference numeral 19, a pulse waveform corresponding to difference ΔDC between DC offsets before and after the gain change is shown. In a box marked by reference numeral 20, an extended waveform of the pulse 19 output from the last-stage FGA is shown.

The high-pass filter HPF is assumed having ideal capability of cutting off frequencies up to 43 kHz completely. After the pulse 19 corresponding to difference ΔDC between DC offsets passes through the HPF, its resultant waveform is shown in FIG. 19B. When the first-stage PGA1 makes gain change from gain number 67 to 68 in the gain table of FIG. 18, noise shown in FIG. 19B is produced as the value of 3 σ.

Figure 19B:
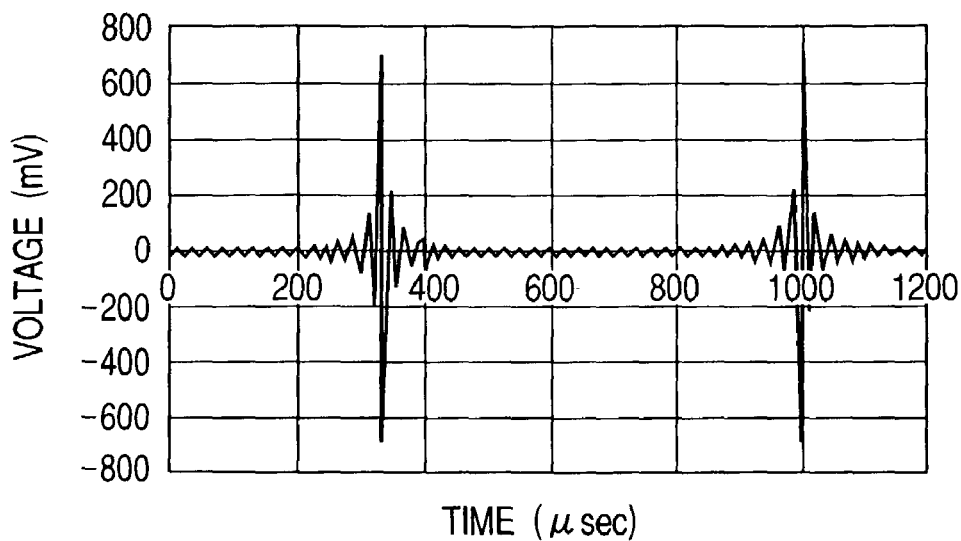
FIG. 19B shows a waveform of noise produced by gain change made by a first-stage programmable gain amplifier.

For the noise produced by gain change, shown in FIG. 19B, let us calculate the resultant SIR degradation. As an assumptive condition, the PGAs make gain change in one slot cycles. At this time, the noise shown in FIG. 19B, if it occurs in one slot cycles, results in an SIR degradation of 1.68 dB. The noise, if it occurs in one frame cycles, results in an SIR degradation of 0.15 dB. In particular, control signals such as TPC and TFCI may be received in 4.2 μsec. as the shortest receiving time in some slot format, as is seen from FIG. 2B. If the peak of the noise shown in FIG. 19B coincides with this receiving time, it causes an SIR degradation of 15.03 dB in the TCP and TFCI signals.

To what degree of the SIR degradation caused by gain change made by the PGAs, is such degradation tolerant? This issue will be discussed, using FIGS. 20 to 27.

To calculate SIR, we use the following equation (1).

[Equation 1]

$$SIR_{[dB]} = DPCH\_Ec_{[dBm]} + Gp_{[dB]} - 10 \cdot \log \{10^{\{10 \cdot \log kT_0B + NF_{[dB]}\}[dBm]/10} + 10^{Ioc[dBm]/10}\}_{[dBm]} - SIR\_degradation_{[dB]} \quad (1)$$

where
DPCH_Ec: Energy per DPCH chip
Gp: Process gain
k: Boltsmann constant $1.38 \times 10^{-23}$ [J/K]
$T_0$: standard temperature 290 [k]
B: 3.84 [MHz]
NF: Noise Figure
Ioc: Additive White Gaussian Noise (AWGN)
SIR_degradation: SIR degradation in the RF and BB portions Equation (1) regards thermal noise, AWGN, and SIR deterioration on the receiver system as interference factors.

To calculate SIR expressed in equation (1), assumed values of parameters which are obtained from FIGS. 20 to 23B are needed. These assumed values are based on the minimum receiving sensitivity, maximum input level, static propagation conditions from the 3GPP standards.

Figures 20, 21:
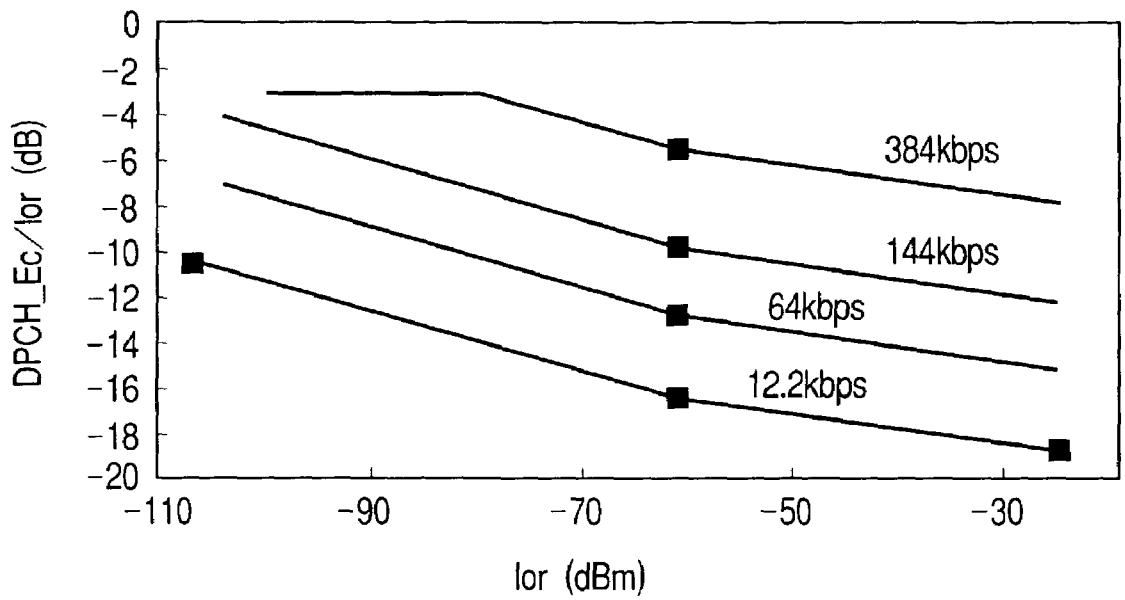
FIG. 20 is a characteristic graph showing relationships between Ior and DPCH_EC by plotting assumed values thereof for SIR calculation.
FIG. 21 is a table of process gains obtained on standard measurement channels for W-CDMA.

FIGS. 20 to 20B will be explained below.

Relationships between the receiving level Ior at the antenna of the mobile terminal and the energy per DPCH signal chip DPCH_Ec for transfer rates of 12.2, 64, 144, and 384 kbps, respectively are represented in FIG. 20. Black square marks in FIG. 20 indicate values specified in the 3GPP standards.

FIG. 21 is a table of process gains of signal components obtained by spectrum de-spreading that is proper to W-CDMA. Because the spreading ratio differs, depending on the slot format, the process gain also differs, depending on the slot format. In the table of FIG. 21, the process gains are 21.07, 15.05, 12.04, and 9.03 dB for the transfer rates of 12.2, 64, 144, and 384 kbps, respectively. These process gains are obtained on standard measurement channels specified in the 3GPP standards.

Figures 22A, 22B:
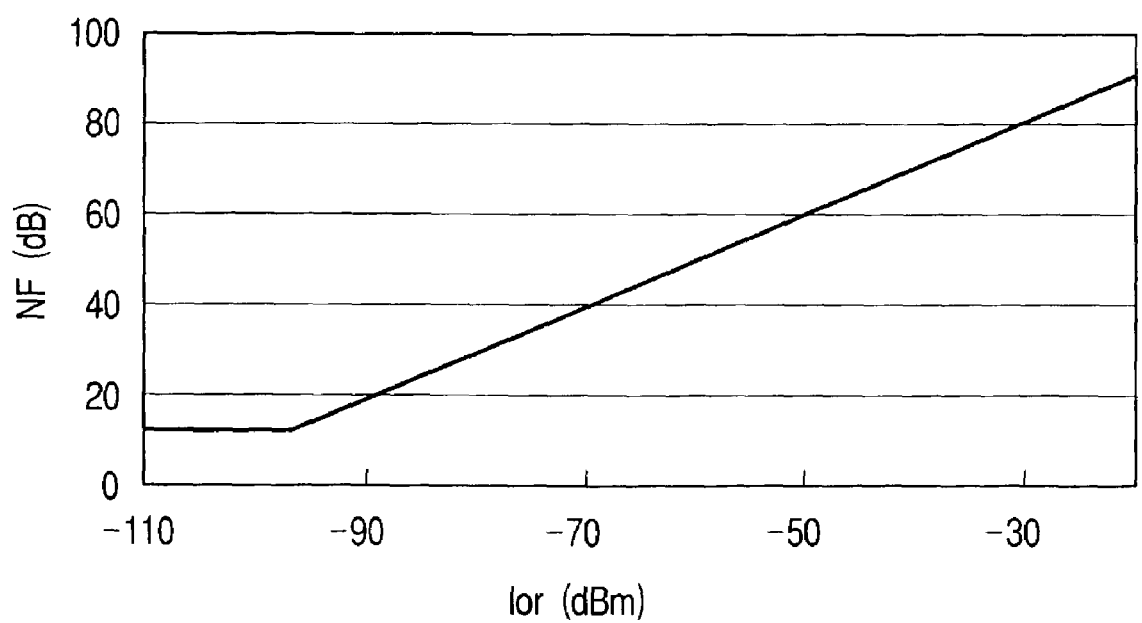
FIG. 22A is a table of assumed NF values of devices in the system for SIR calculation.
FIG. 22B shows a characteristic curve of NF vs. Ior of the programmable gain amplifiers section.

FIG. 22A lists assumed noise figures NFs of an antenna changeover switch SW, duplexer DPX, and low noise amplifier LNA and mixer MIX in the receiver system.

The antenna changeover switch SW and duplexer DPX which are not included in the receiver configuration of FIG. 1 are considered in SIR calculation for the following reasons.

If the receiver accommodates two ore more standards using different bands, for example, W-CDMA and PDC (Personal Digital Cellular), the antenna changeover switch is required. For concurrent operation of the transmitter and the receiver, the duplexer is normally used.

The antenna changeover switch changes connection from one antenna to another across a plurality of antennas. The duplexer transmission system is a device which suppresses crosstalk from the transmission system to the reception system and vice versa and fills the role of a filter allowing only signals in the transmitting band to pass for signals from the transmission system to the antenna and only signals in the receiving band to pass for signals from the antenna to the receiving system. In the receiver configuration of FIG. 1, the antenna changeover switch SW and duplex DPX may be located between the antenna 101 and the low noise amplifier 102.

The NF of the programmable gain amplifiers section differs, depending on the gain. The gain varies, depending on the receiving level Ior. Thus, a relationship between the receiving level Ior and the noise figure NF of the AGC section is assumed to be represented by a characteristic curve shown in FIG. 22B.

Figure 23A:
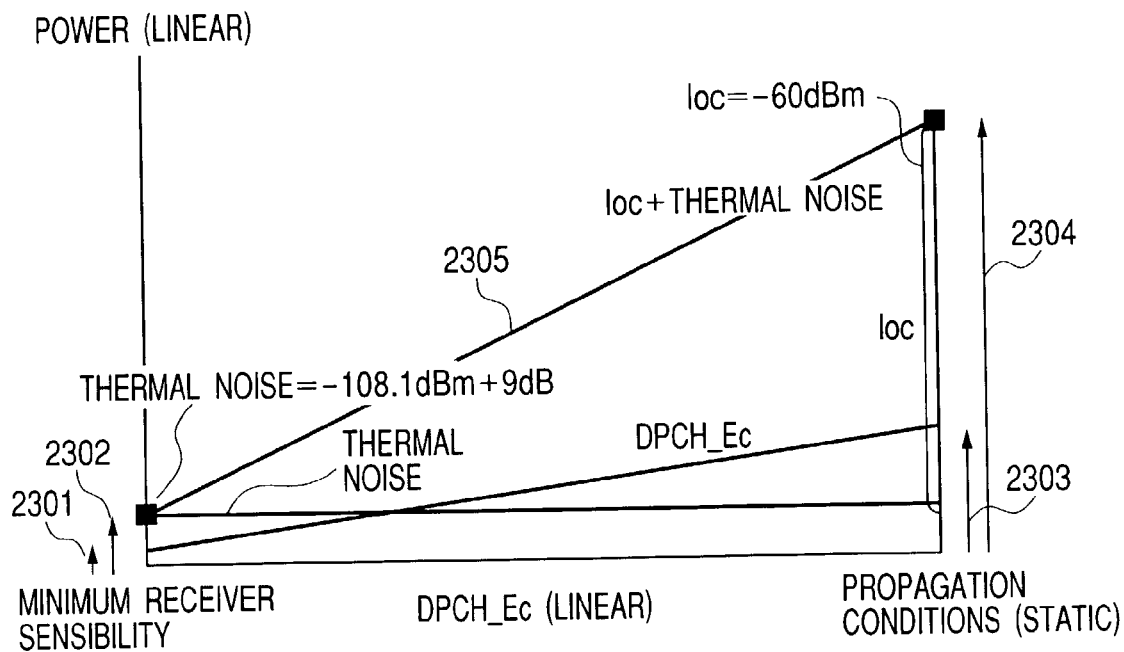
FIG. 23A is a characteristic graph showing a relationship between Ioc and DPCH_Ec by plotting assumed values thereof for SIR calculation.
Figure 23B:
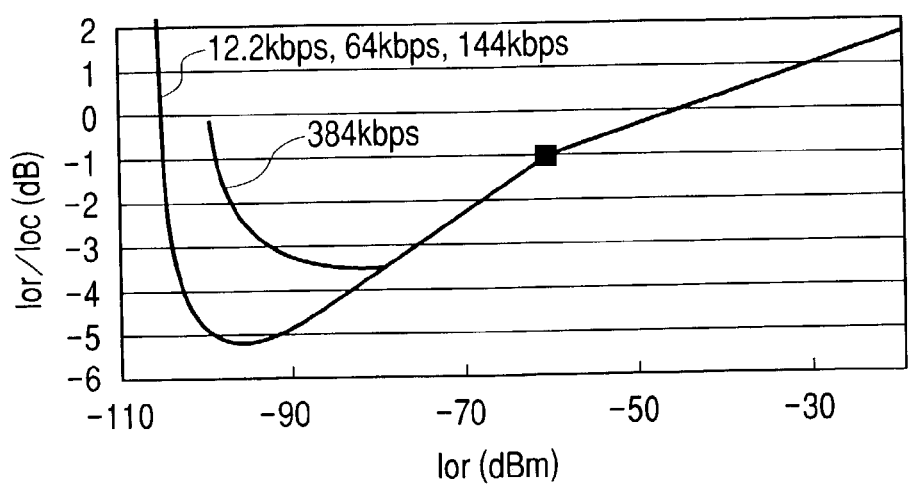
FIG. 23B is a characteristic graph showing relationships between Ioc and Ior by plotting assumed values thereof for SIR calculation.
Figure 25A:
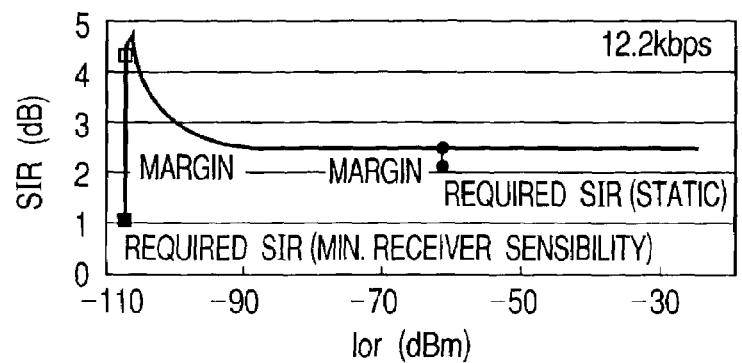
FIGS. 25A–25D are characteristic graphs showing SIR calculation results and margins.
Figure 25B:
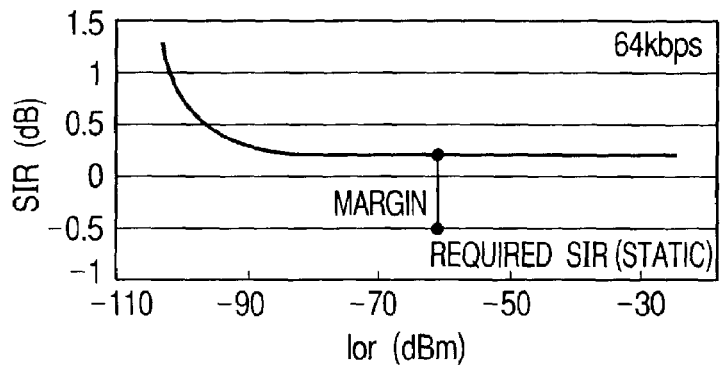
Figure 25C:
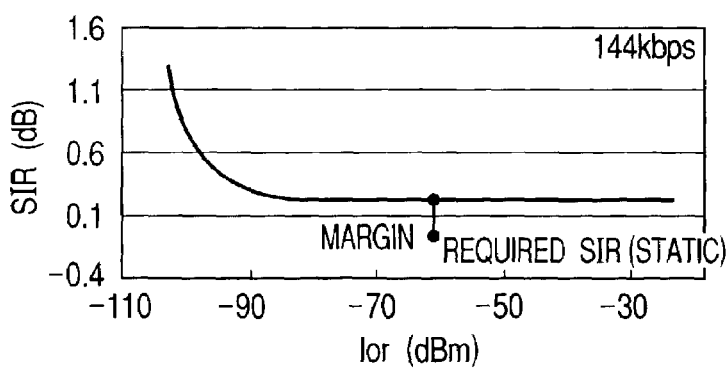
Figure 25D:
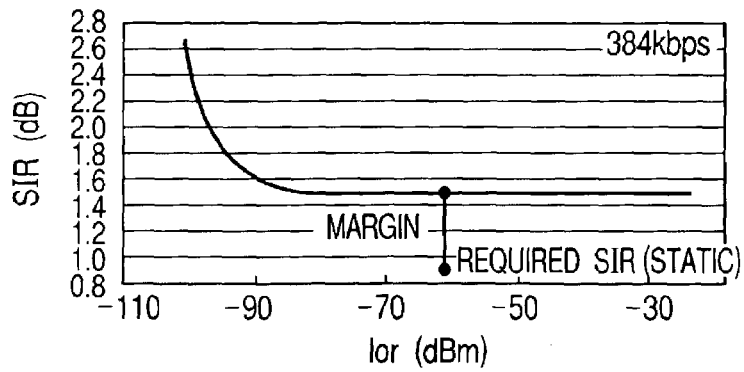

FIG. 23A shows a relationship between the AWGN level Ioc and the energy per DPCH signal chip DPCH_Ec by plotting assumed values of these parameters, wherein the chips are signal components. The 3GPP standards estimate the noise figures NF of the devices in the receiver system at the minimum receiving sensitivity at about 9 dB. As regards the AWGN level Ioc when the propagation conditions are static, the 3GPP standards specify the AWGN level Ioc so that the ratio of "DPCH_Ec (2303)" to "Ioc+thermal noise (2304)" is equal to the ratio of "DPCH_Ec (2301)" to "thermal noise+system noise (2302)" at the minimum receiving sensitivity. Thus, it can be said that values of Ioc should be assigned to set propagation conditions maintaining a constant ratio of Ioc to DPCH_Ec. The values of Ioc are plotted on a characteristic line marked by reference numeral 2305 in FIG. 23A. From the above, relationships between Ior and Ioc for the transfer rates of 12.2, 64, 144, and 384 kbps can be derived as is shown in FIG. 23B.

Using the above-mentioned assumed values of the parameters shown in FIGS. 20 to 23B, equation (1) for obtaining SIR can be evaluated.

The 3GPP standards recommend the bit error rates (BER) and block error rates (BLER) per transfer rate for the minimum receiving sensitivity, maximum input, and static propagation conditions as is listed in the table of FIG. 24. The table of FIG. 24 includes experimentally obtained values of required SIR. SIR to be obtained by evaluating equation (1) must fulfill the required SIR.

Difference between the SIR to be obtained by evaluating equation (1) and the required SIR given in FIG. 24 can be regarded as some margin.

FIGS. 25A–25D show relations between SIR obtained by evaluating equation (1) and the required SIR given in FIG. 24 for the transfer rates of 12.2, 64, 144, and 384 kbps with the receiving level Ior changing on the abscissa. Equation (1) does not take SIR degradation due to gain change made by the programmable gain amplifiers into consideration. Thus, the SIR degradation must falls within the margin.

Figure 26A:
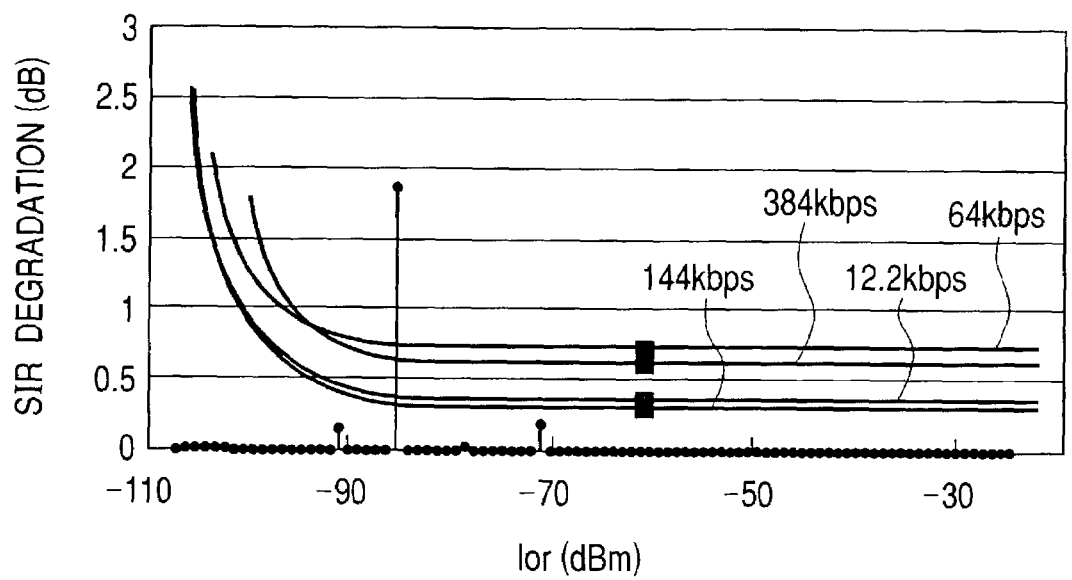
FIGS. 26A and 26B show SIR degradation due to gain change, occurring over the range of Ior, and margins.
Figure 26B:
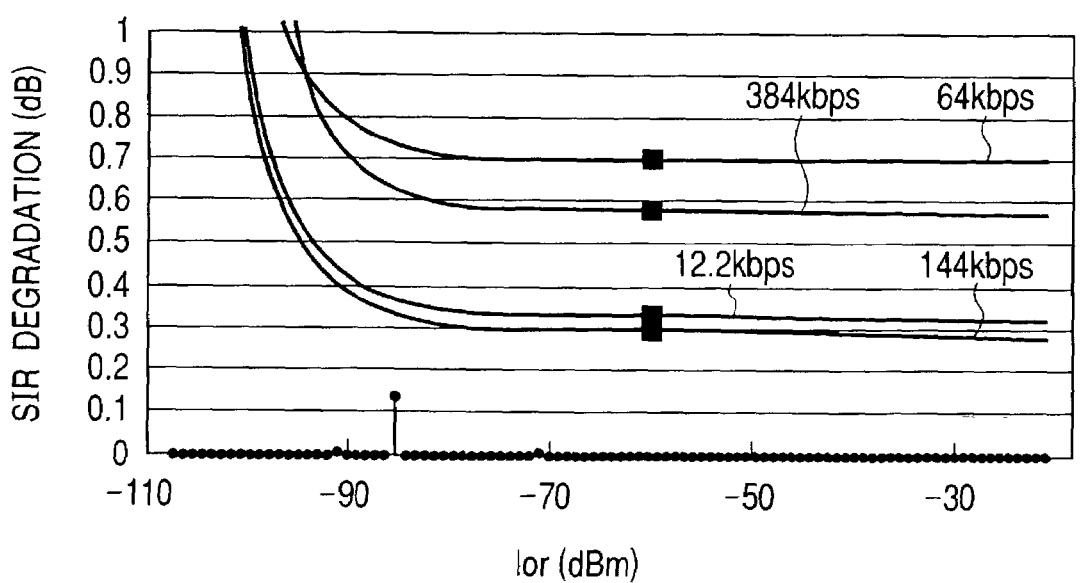
Figure 27A:
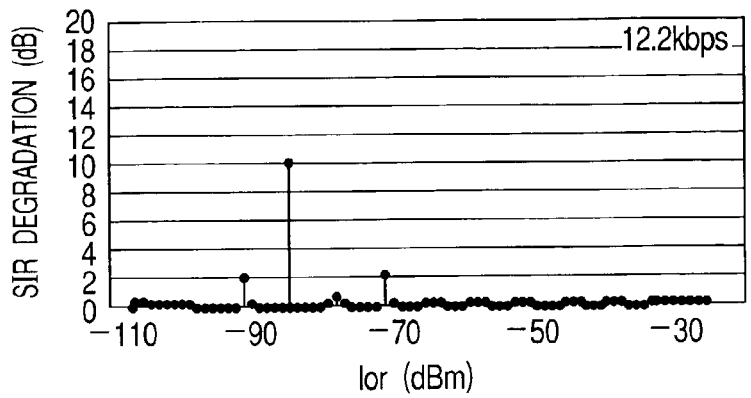
FIGS. 27A–27D are characteristic graphs showing SIR degradation occurring to a control signal.
Figure 27B:
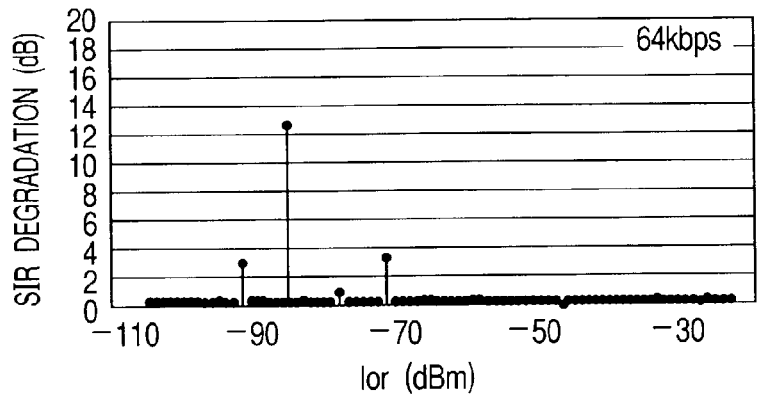
Figure 27C:
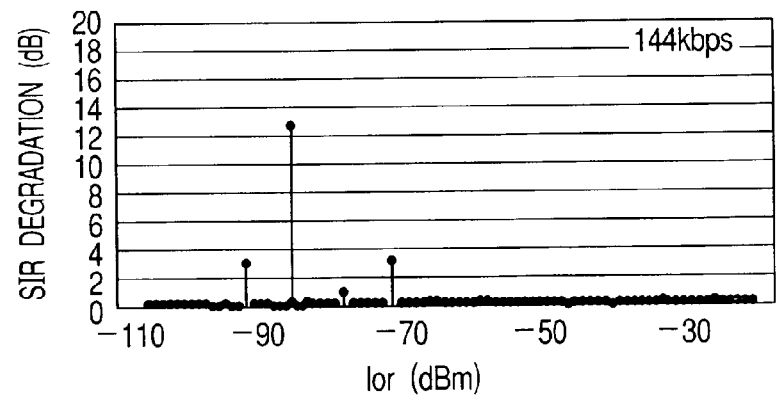
Figure 27D:
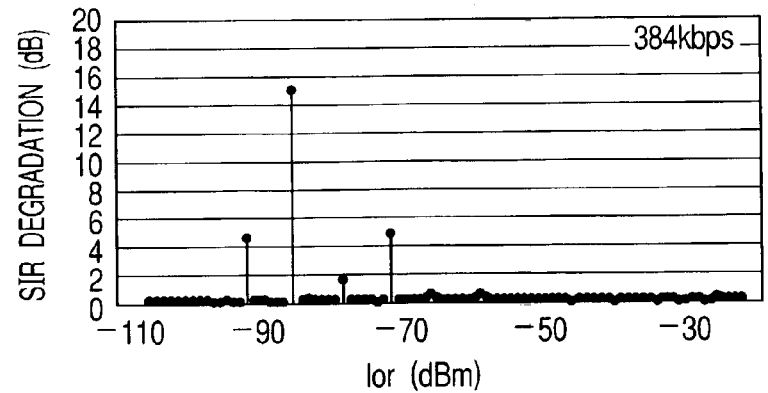

SIR degradation at the value of 3 σ which is thought to occur over the range of receiving level Ior is represented in FIGS. 26A and 26B. In FIGS. 26A and 26B, the SIR calculations and margins shown in FIGS. 25A–25D are also plotted. FIG. 26A shows SIR degradation when the programmable gain amplifiers made gain change in one slot cycles. FIG. 26B shows SIR degradation when the programmable gain amplifiers made gain change in one frame cycles.

In FIG. 26A, a great SIR degradation occurs in the neighborhood of −85 dBm of receiving level Ior. This is due to gain change from 12 dB to 18 dB in the first-stage programmable gain amplifier PGA1 in the environment shown in FIGS. 19A and 19B.

From the above, it is seen that noise due to gain change made by the first-stage programmable gain amplifier causes the greatest SIR degradation. At this time, if control is exerted such that the programmable gain amplifiers make gain change in one slot cycles, SIR degradation beyond the margin occurs. Accordingly, when the programmable gain amplifiers make gain change very frequently, a quality problem is thought to arise in data signals received at a certain receiving level. Horizontal lines with a black square mark indicate the margins for each transfer rate.

From FIG. 26B, it is seen that SIR degradation falls within the margin when the programmable gain amplifiers make gain change in one frame cycles.

Then, FIGS. 27A–27D show SIR degradation at the value of 3 σ occurring to the control TPC or TFCI signal at gain change timing over the range of receiving level Ior. FIGS. 27 assume that receiving the TCP or TFCI signal coincides with the noise peak due to gain change. From FIGS. 27A–27D, it is seen that quite a great SIR degradation over 10 dB occurs in the neighborhood of −85 dBm of receiving level Ior for all the transfer rates of 12.2, 64, 144, and 384 kbps. Considering that error correction does not apply to control signals, it can be said that a control signal with quite a great SIR degradation of the order of 10 dB is not received properly.

The TPC and TFCI signals are included in every slot. If the programmable gain amplifiers are controlled to make gain change in one slot cycles, it is possible that the control signals such as TPC and TFCI cannot be received at all in the neighborhood of −85 dBm of receiving level Ior. If the programmable gain amplifiers are controlled to make gain change in one frame cycles, it is possible that control signals cannot be received with a probability of one fifteenth. For the TFCI signal, if SIR degradation over 10 dB occurs in one of the 15 signals, it affects the remaining 14 signals and has a great impact on the block error rate BLER.

It is considered necessary to control gain change timing so that it does not coincide with the timing of receiving the TFCI signal from coinciding with gain change. It is also necessary to prevent control signals to which error correction does not apply such as TPC and Pilot from coinciding with gain change. Accordingly, the programmable gain amplifiers should be controlled to make gain change during reception of data signals. Preferably, control is exerted so that gain change occurs at the beginning of a data signal received, so the impact of accompanying noise can be minimized.

<Embodiment 2>

A preferred Embodiment 2 of the present invention will be described, using FIG. 5. As another method of suppressing the effect of noise produced by gain change made by the programmable gain amplifiers by which gains are adjustable in steps, means for causing the programmable gain amplifiers to make gain change at random timing are applied. Gain change at random timing can eliminate the possibility that timing of receiving control signals such as TPC, TFCI, and Pilot always coincides with timing of noise occurring, that is, when the programmable gain amplifiers make gain change.

Because of the random mode of gain change, the sequencer need not identify which slot format is being received. For example, a device that randomly delays the control signals to the programmable gain amplifiers should be installed in the receiver circuitry. As an example of such device, a device configured as shown in FIG. 5 should be installed on the control signal line. Specifically, in the receiver configuration shown in FIG. 1, the device should be connected to the control signal line 111 from the AGC controller 111 to the programmable gain amplifiers and filters section 104.

Figure 5:
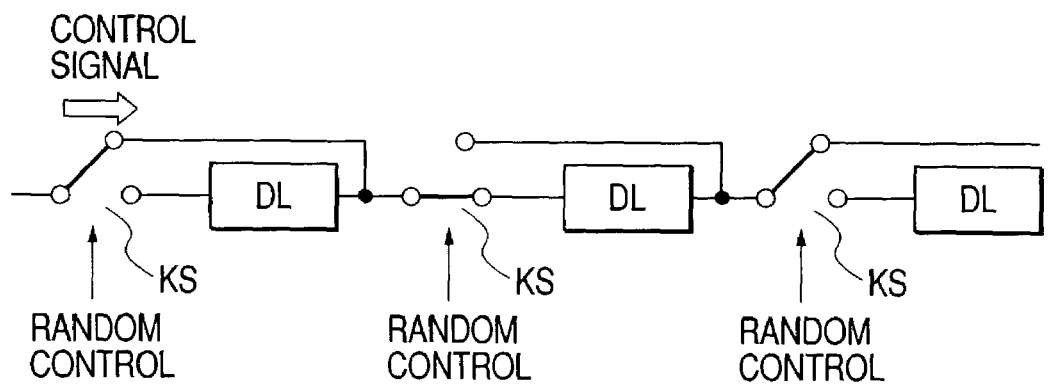
FIG. 5 is a circuitry diagram of a device for controlling gain change at random timing, according to the present invention.

The device of FIG. 5 comprises a plurality of delay elements and switches. For a delay element, its switch switches connection between a line passing the delay element and a line bypassing it. By controlling the switches with random numbers, the control signals to the programmable gain amplifiers are delayed randomly. As a result, gain change takes place at random timing.

<Embodiment 3>

A preferred Embodiment 3 of the present invention will be described, using FIG. 9. In a multistage configuration with programmable gain amplifiers by which gains are adjustable in steps, gain change made by the first-stage programmable gain amplifier results in a great noise. This is because noise produced in the first stage is amplified by the following stages of programmable gain amplifiers.

Figure 9A:
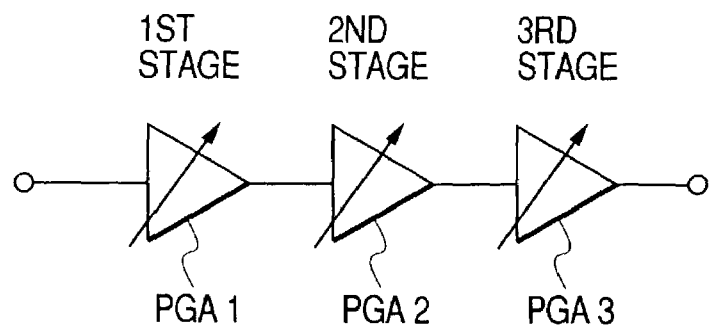
FIG. 9A shows three stages of programmable gain amplifiers according to the invention.
Figure 9B:
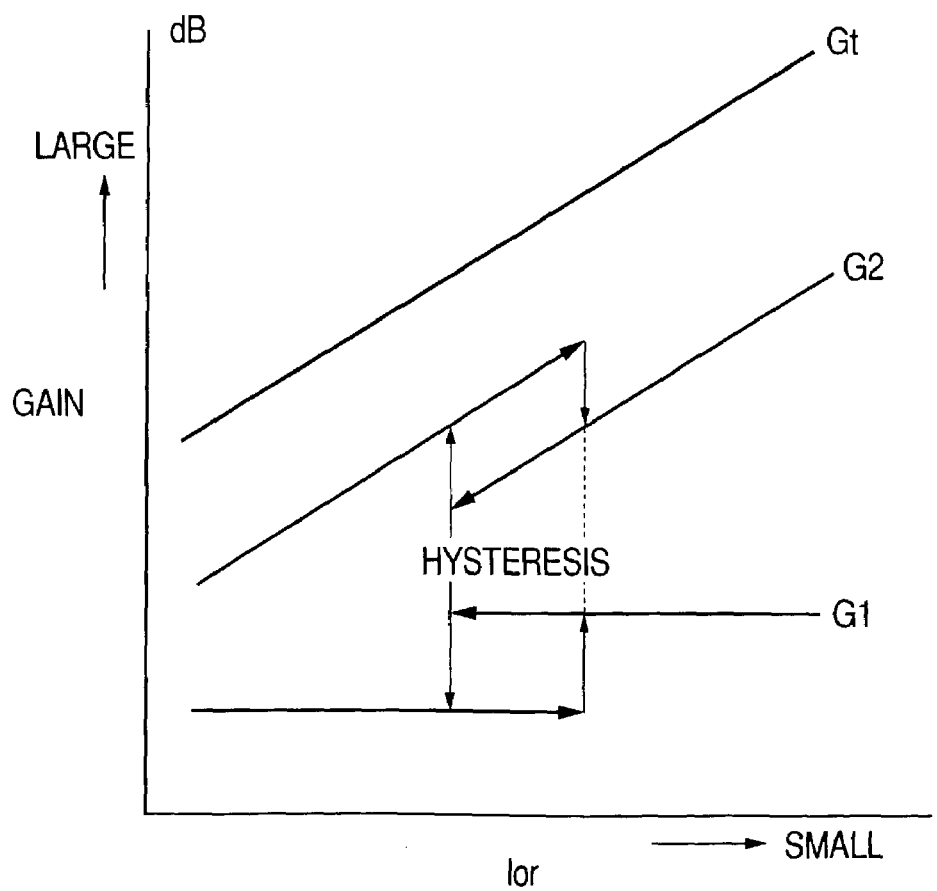
FIG. 9B is a gain characteristic graph with hysteresis of the first-stage programmable gain amplifier.

In this embodiment, the first-stage programmable gain amplifier is arranged to have hysteresis. This can reduce both the frequency of gain change by the first-stage programmable gain amplifier and the frequency of a great noise occurring. For example, when a programmable gain amplifiers section is composed of three stages of programmable gain amplifiers, PGA1, PGA2, and PGA3, as is shown in FIG. 9A, a gain table should be created so that PGA1 has hysteresis, as is shown in FIG. 9B. In FIG. 9B, the receiving level Ior on the abscissa decreases toward the right and gain on the ordinate increases toward up. A characteristic line G1 corresponds to the characteristic of the first-stage programmable gain amplifier PGA1 having hysteresis. A characteristic line G2 corresponds to the characteristics of the second-stage and third-stage programmable gain amplifier PGA2 and PGA3 and a Gt line corresponds to a total gain. The gain table containing data on such characteristics should be stored into a memory. For example, in the receiver configuration of FIG. 1, the memory should be installed in the AGC controller 111 or the programmable gain amplifiers and filters section 104. The receiver should be arranged to control gain change by referring to the gain table.

<Embodiment 4>

Figure 28:
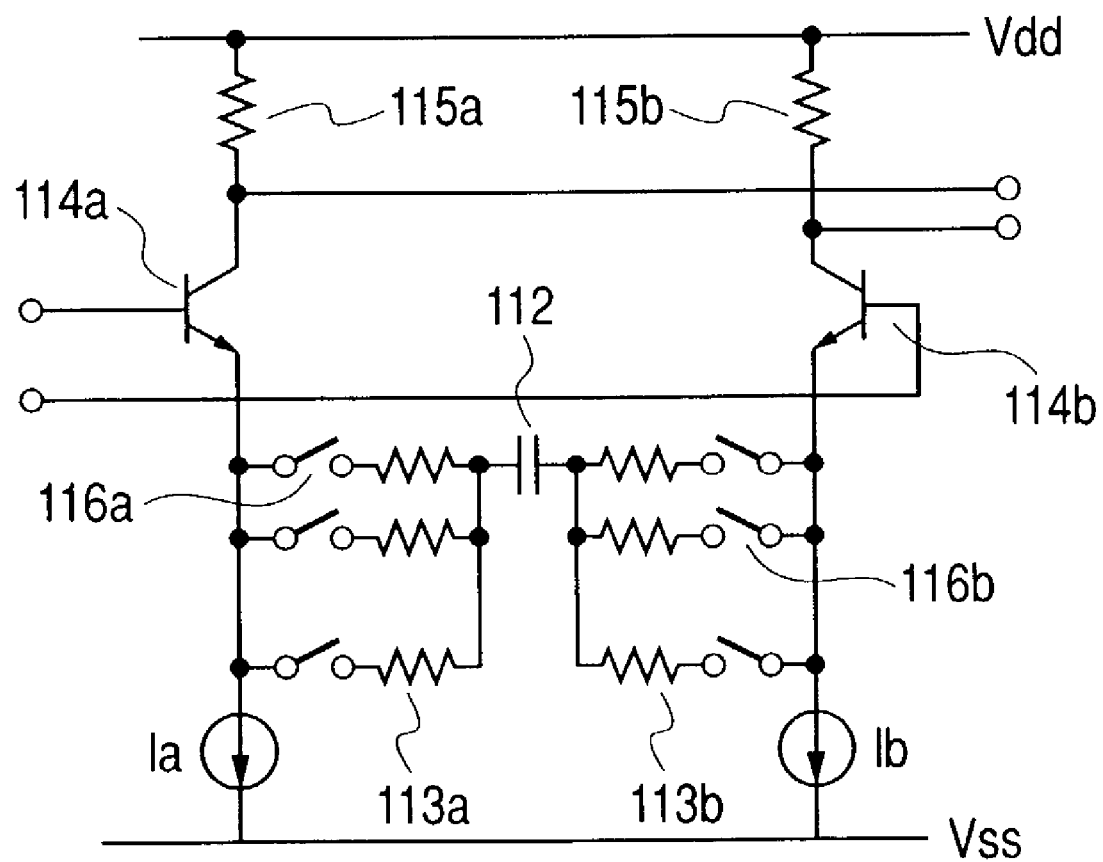
FIG. 28 is a circuitry diagram showing a configuration example of a programmable gain amplifier by which gains are adjustable in steps according to the present invention.

A preferred Embodiment 4 of the present invention will be described, using FIG. 28. FIG. 28 is a circuitry diagram showing a configuration example of the first-stage programmable gain amplifier out of the three programmable gain PGA1 to PGA3 by which gains are adjustable in steps in the programmable gain amplifiers and filters section 104 in the receiver circuitry of FIG. 1. In the circuitry of FIG. 28, the capacitor can perform the high-pass filter function as well.

The programmable gain amplifier by which gains are adjustable in steps, shown in FIG. 28, is a circuit arranged so noise accompanying gain change is hard to produce. In the programmable gain amplifier by which gains are adjustable in steps, shown in FIG. 28, reference numeral 112 denotes the capacitor. One end of the capacitor 112 is connected via a plurality of parallel resistors 113*a* and switches 116*a* which are respectively connected in series to the resistors 113*a* to the emitter of a transistor 114*a*. Similarly, the other end of the capacitor 112 is connected via a plurality of parallel resistors 113*b* and switches 116*b* which are respectively connected in series to the resistors 113*b* to the emitter of a transistor 114*b*. The emitters of the transistors 114*a* and 114*b* are respectively connected via current sources Ia and Ib to a ground power supply Vss. The collectors of these transistors are respectively connected via resistors 115*a* and 115*b* to a power supply Vdd.

The transistors 114*a* and 114*b* form a differential pair of equal characteristics, the resistors 115*a* and 115*b*, which function as load resistance, form a pair of equal characteristics, and so do current sources Ia and Ib.

The thus configured programmable gain amplifier is characterized in that the emitters of the transistors 114 and 114*b* forming a differential pair are connected via the capacitor 112. Because the capacitor 112 is present, the DC level does not change even if the resistors 113*a* and 113*b* are disconnected from and reconnected to the circuit by the switches 116*a* and 116*b*, respectively. Thus, the output DC offset value does not change even if gain change is made. Accordingly, this circuit has the advantage that noise to be generated is lessened.

However, when the above switches 116*a* and 116*b* are embodied in MOSFETs, if the switch on-resistance becomes large, a great gain is hard to obtain. As means for decreasing the on-resistance, it is necessary to increase the size of the MOSFET used as a switch.

Figure 10:
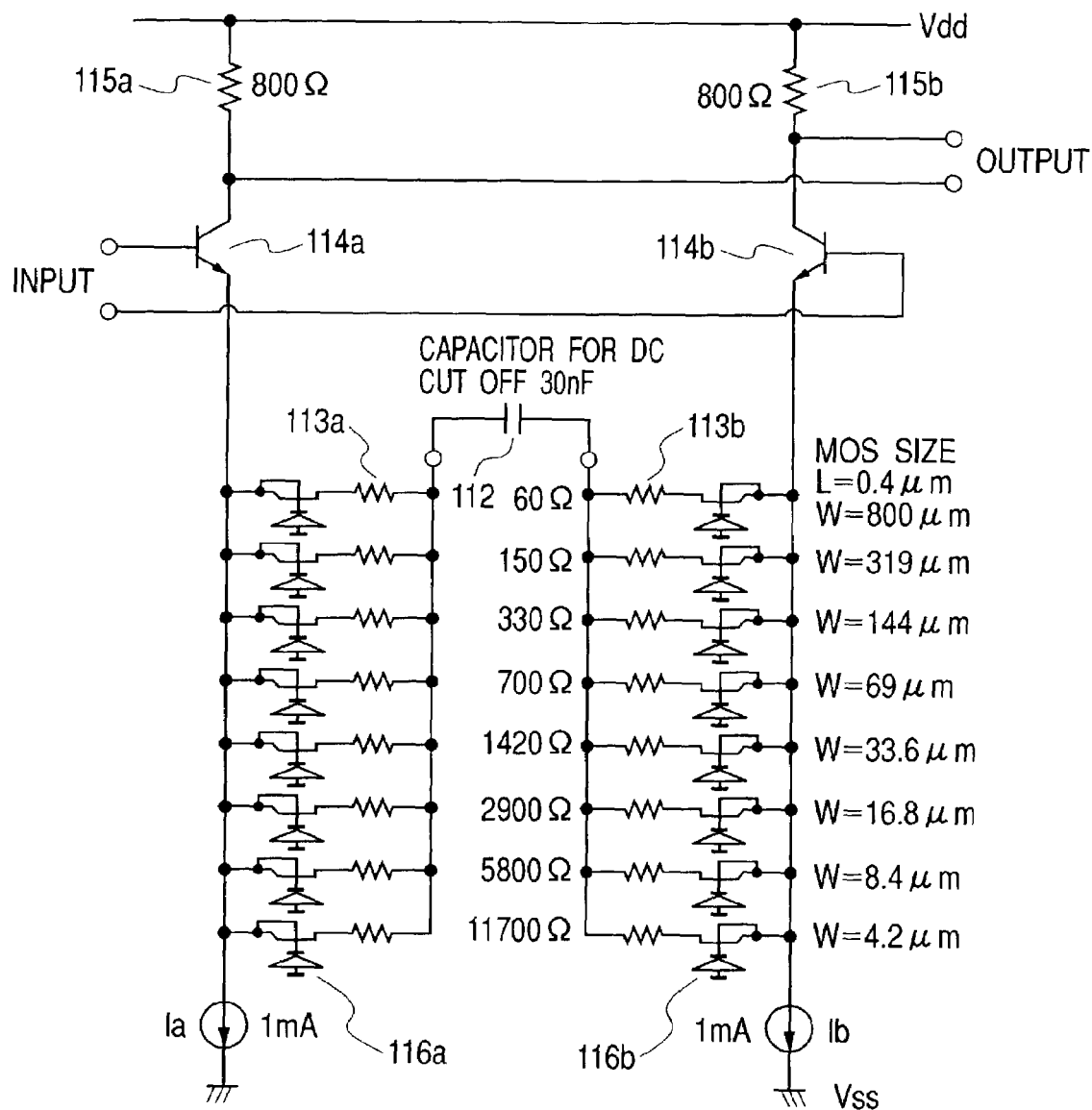
FIG. 10 is a circuitry diagram of a programmable gain amplifier according to the present invention.
Figure 11:
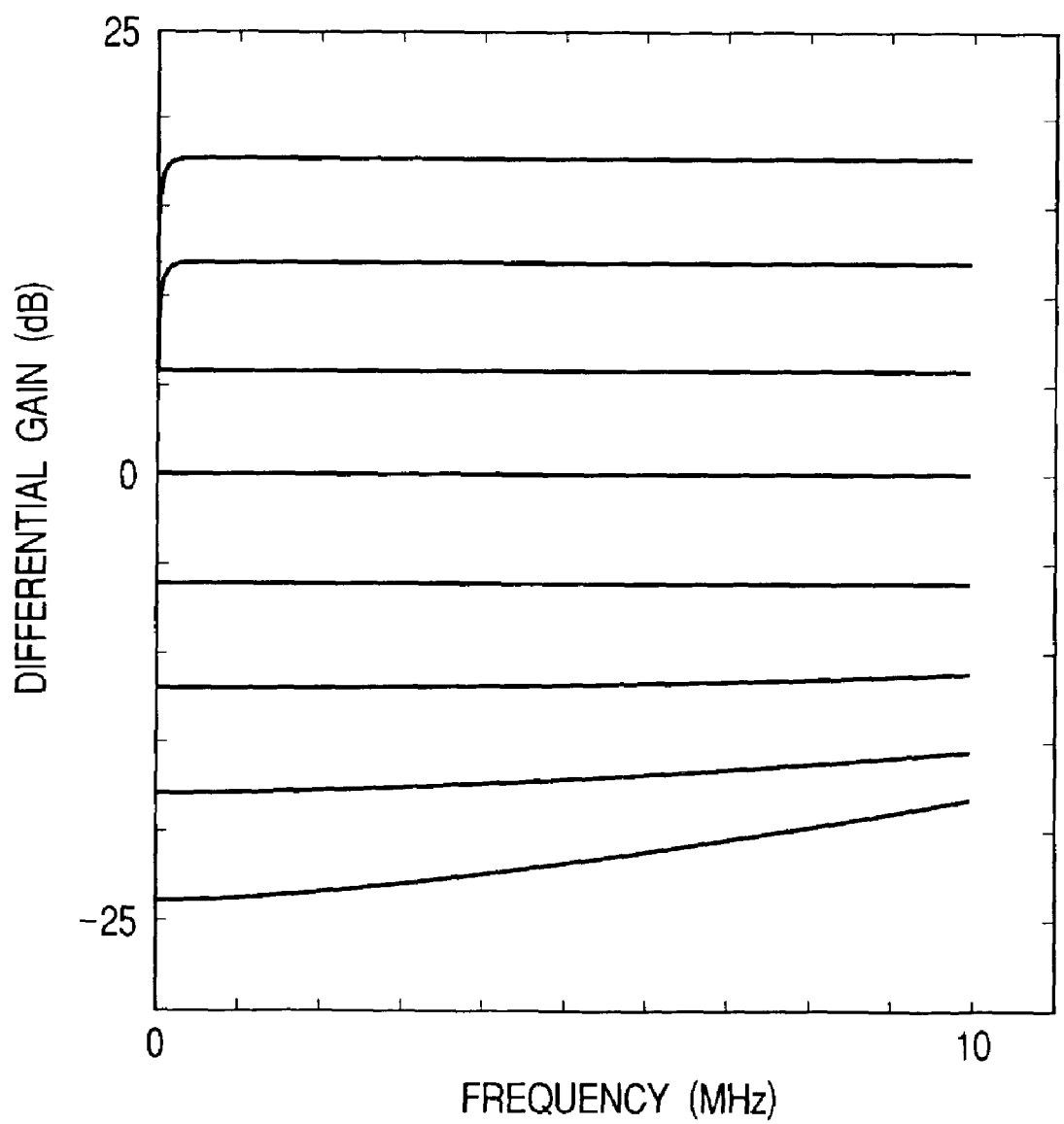
FIG. 11 shows the amplitude characteristic of the programmable gain amplifier of FIG. 10.

With the individual elements of the above programmable gain amplifier circuit having their electrical values as shown in FIG. 10, the circuit operation was simulated to obtain amplitude characteristics, the result of which is shown in FIG. 11. In FIG. 10, as the switches 116*a* and 116*b*, switches embodied in CMOS inverters are used. From FIG. 11, it is seen that gain rises with frequency increase up to about 10 MHz, as compared with a low frequency.

This is because the device capacity increased due to the increased size of the MOSFET for decreasing the on-resistance.

<Embodiment 5>

Figure 12:
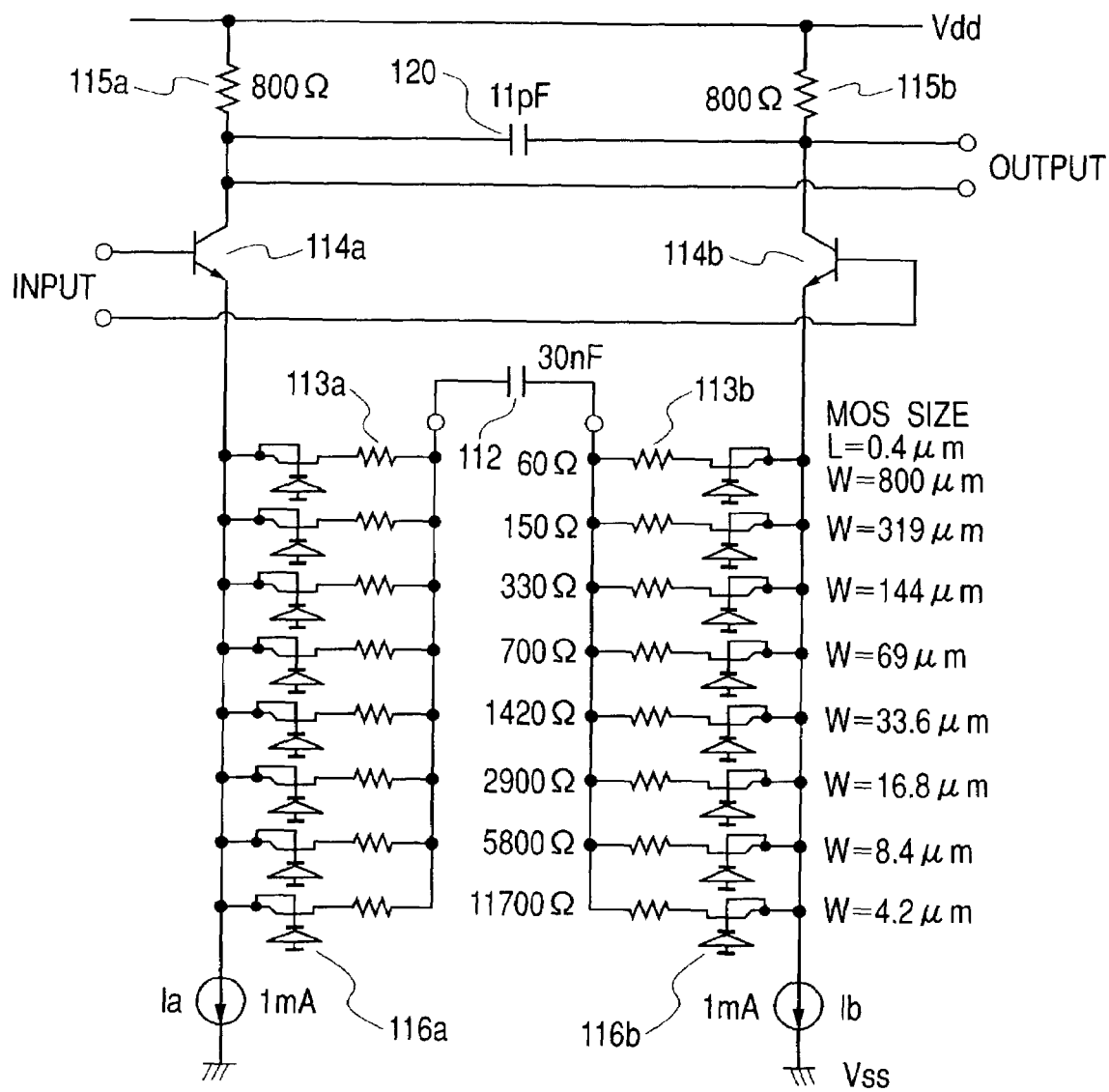
FIG. 12 is another circuitry diagram of a programmable gain amplifier according to the present invention.
Figure 13:
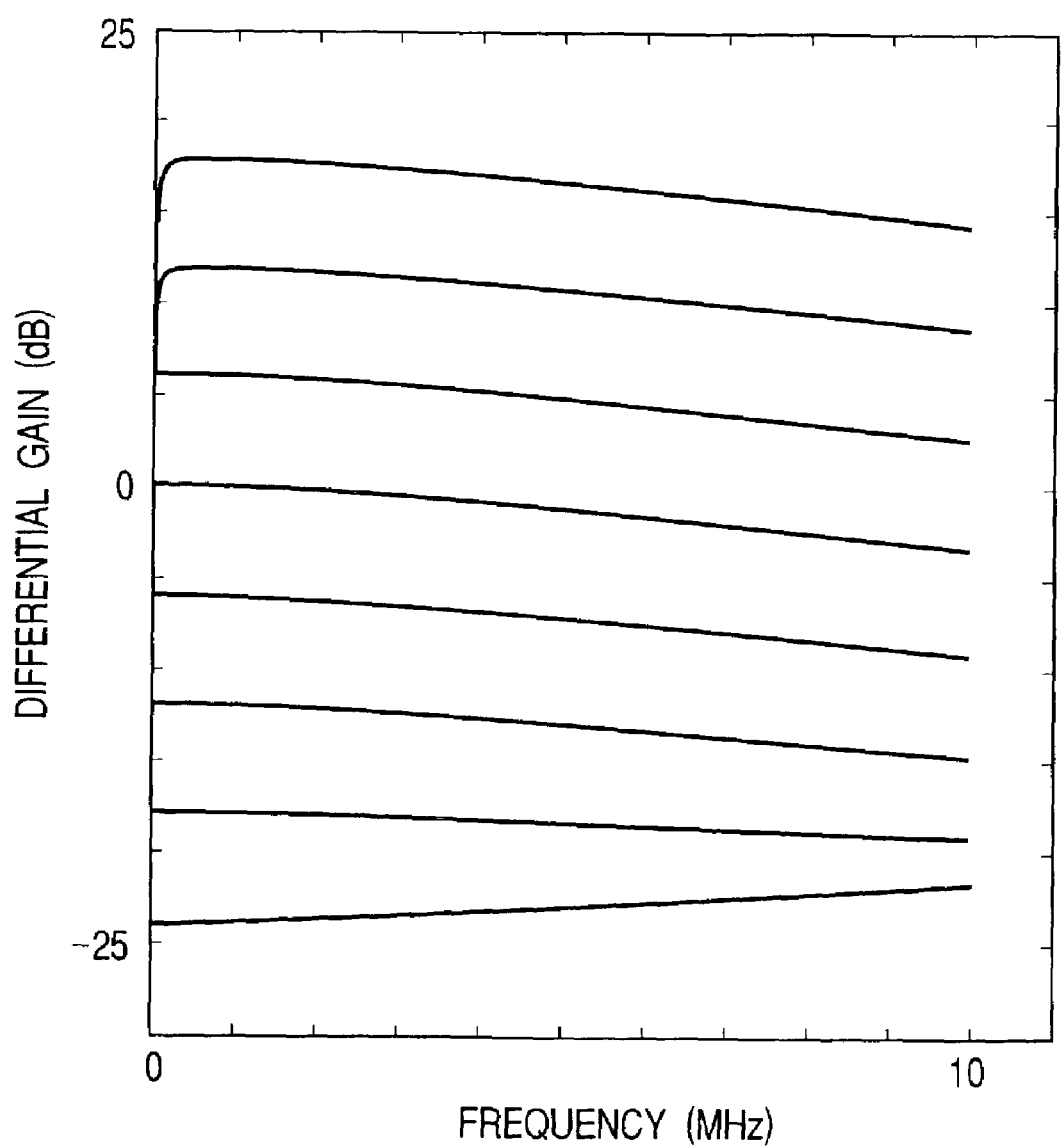
FIG. 13 shows the amplitude characteristic of the programmable gain amplifier of FIG. 12.

A preferred Embodiment 5 of the present invention will be described, using FIG. 12. Gain rise at a high frequency shown in FIG. 11 can be suppressed by connecting a capacitor 120 to a section between the collectors, as is shown in FIG. 12. With the capacitor 120 having 11 pF and other elements of the programmable gain amplifier circuit having the same electrical values as shown in FIG. 10, the circuit operation was simulated, the result of which is shown in FIG. 13.

Figure 14:
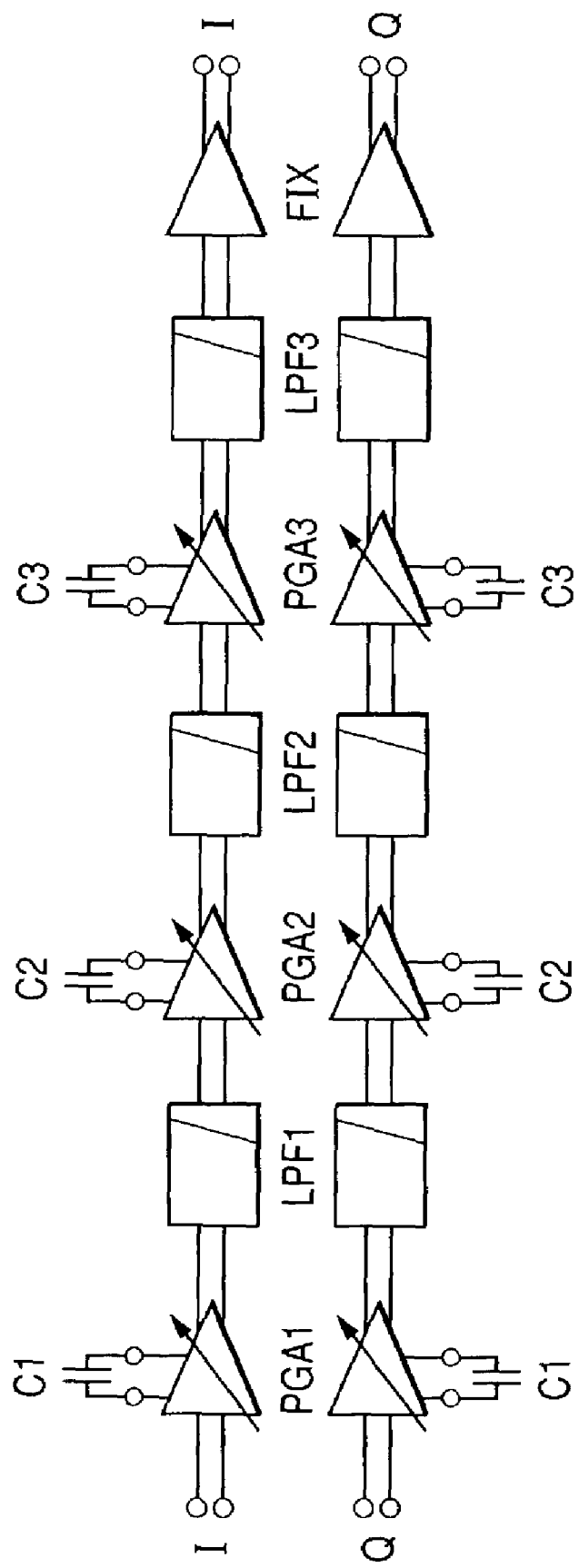
FIG. 14 shows an overall structure of a programmable gain amplifiers section according to the present invention.

A multistage configuration of programmable gain amplifiers by which gains are adjustable in steps is commonly applied; however, a fear of saturation arises with amplification. Accordingly, it is advisable to suppress adjacent channel interference waves in steps. For this purpose, low-pass filters LPF1, LPF2, and LPF4 and programmable gain amplifiers PGA1, PGA2, and PGA3 are alternately placed as is shown in FIG. 14. At each low-pass filter and each programmable gain amplifier, a DC component is generated and a fear of saturation arises in the filter or amplifier following the one in which DC was generated. Normally, this problem is solved by inserting capacitors between the programmable gain amplifier stages. In this case, however, between the programmable gain amplifier stages of differential configuration, two external capacitors are required. If I and Q of a quadrature modulator are considered, four external capacitors are required.

In contrast, if the programmable gain amplifier of the present invention is used in which the capacitor exists between the emitters of the differential pair transistors, as shown in FIGS. 10 and 11, the DC component is cut off. Thus, the number of external capacitors to be inserted between the stages can be reduced to one per path. Otherwise, two capacitors per path would be required between the stages of the programmable gain amplifiers of differential configuration. External capacitors are identified by C1, C2, and C3 in FIG. 14 on the condition that the DC component is cut off.

<Embodiment 6>

Figure 15:
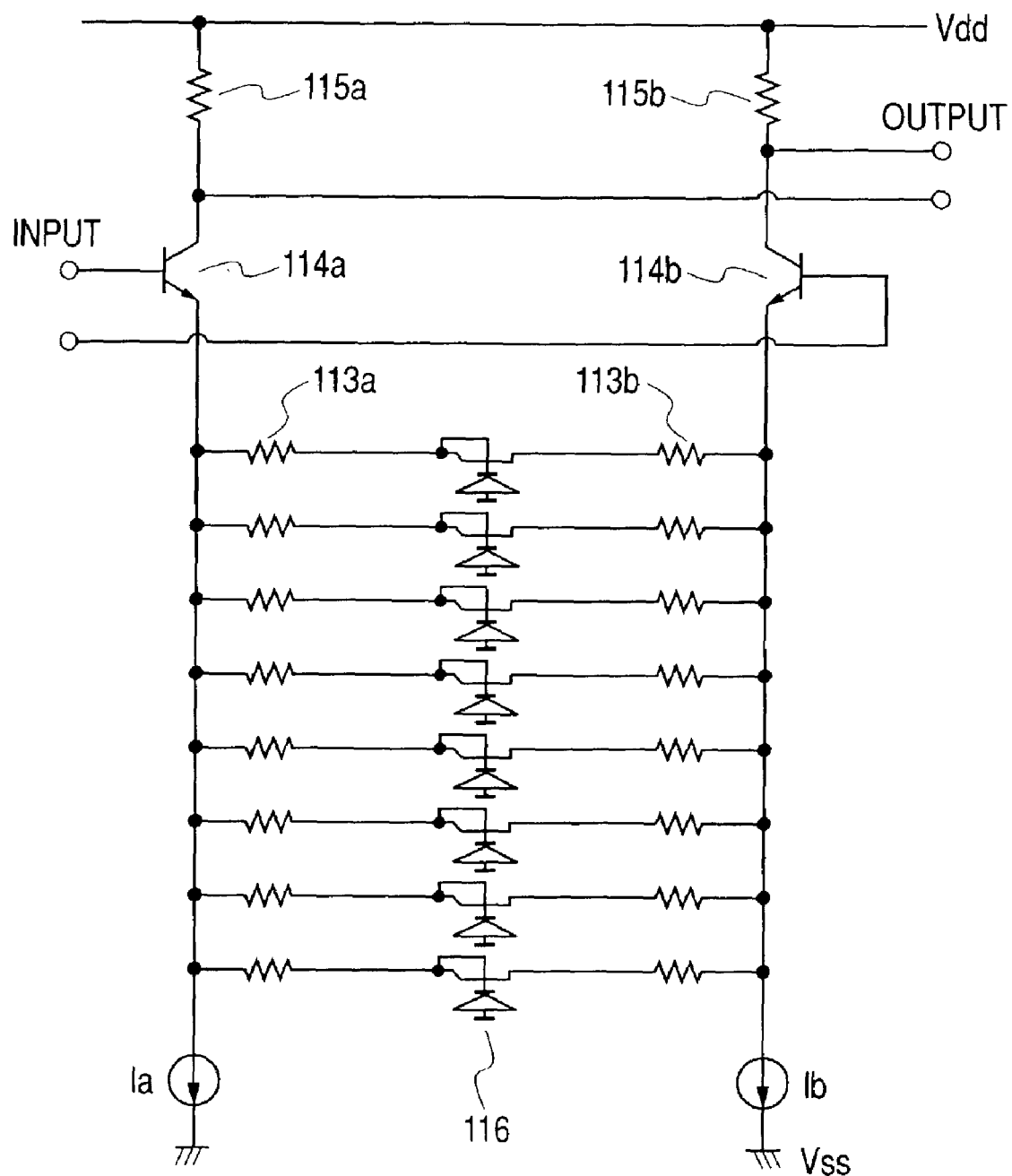
FIG. 15 is yet another circuitry diagram of a programmable gain amplifier according to the present invention.

A preferred Embodiment 6 of the present invention will be described, using FIGS. 15 and 16. To prevent saturation with the DC component, programmable gain amplifiers for which most severely suppressing of the DC component is required in the programmable gain amplifiers and filters section 104 shown in FIG. 1 are the first-stage programmable gain amplifier PAG1 that is the nearest to the output of the mixer 103 and the programmable gain amplifier PAG3 at the later stage where pulses are amplified by gain. The intermediate programmable gain amplifier PGA2 should be configured not to include the capacitor between the emitters as is shown in FIG. 15. Because transistor pair change does not occur with gain change, noise produced by gain change is smaller than that in the circuitry of the conventional programmable gain amplifier shown in FIG. 4.

Figure 16:
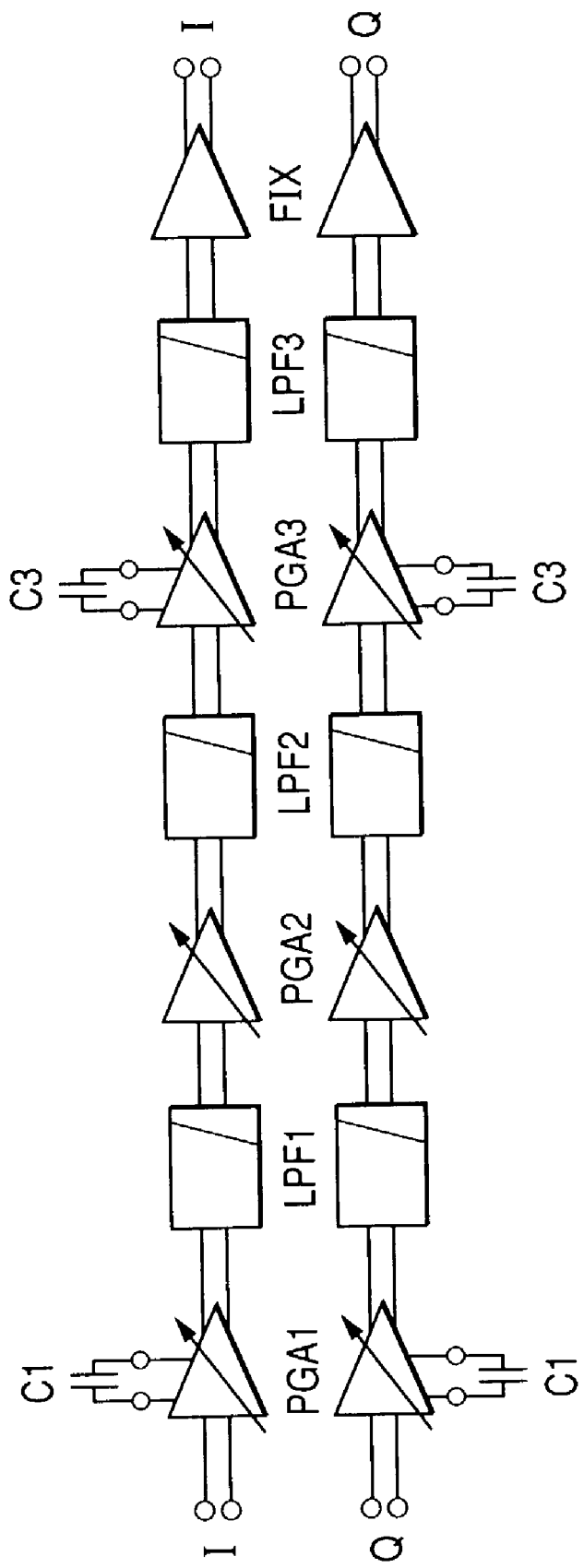
FIG. 16 shows another overall structure of a programmable gain amplifiers section according to the present invention.

Thus, in this embodiment, the block circuitry of the programmable gain amplifiers and filters section 104 shown in FIG. 1 is as shown in FIG. 16. As compared with the corresponding circuitry shown in FIG. 14, the number of external capacitors can decrease by two because capacitors C2 are dispensed with.

As is apparent from the above-described embodiments, according to the present invention, in direction conversion application, a wireless communication receiver that is able to suppress noise produced by gain change made by the programmable gain amplifiers by which gains are adjustable in steps or a wireless communication receiver that is able to alleviate the effect of noise produced by gain change made by such programmable gain amplifiers can be realized.

While several preferred embodiments of the present invention have been described, it should be appreciated that the present invention is not limited to the embodiments described hereinbefore. It will be appreciated that design change or modification in several modes may be made without departing from the spirit of the present invention and within the scope of the invention as deliniated by the appended claims.

What is claimed is:

1. A wireless communication receiver comprising:
    a first mixer for converting received signals to a predetermined baseband frequency by down converting the signals once; and
    a first programmable gain amplifier, which is connected in series to the first mixer at the following stage, and has a gain adjustment function that enables gain change in discrete gains,
    wherein said wireless communication receiver includes a circuit for reducing noise that is generated by discrete gain changing in said first programmable gain amplifier because of their DC offsets, and
    wherein said circuit for reducing noise is a timing control circuit which controls gain change timing that uses a frame structure of receiving signal for reducing noise that is generated by discrete gain changing in said first programmable gain amplifier because of their DC offsets.

2. A wireless communication receiver according to claim 1, wherein said first programmable gain amplifier itself that is connected to mixer at the following stage amplifier has a function of suppressing noise that accompanies gain change.

3. A wireless communication receiver according to claim 2, wherein said first programmable gain amplifier having the function of suppressing noise that accompanies gain change includes first and second transistors which form a differential pair, wherein the emitters of the first and second transistors are connected via a capacitor to reduce the noise that is generated by discrete gain changing in said first programmable gain amplifier because of their DC offsets.

4. A wireless communication receiver according to claim 3, wherein, in said first programmable gain amplifier, the collector of said first transistor and the collector of said second transistor are connected via a capacitor to reduce the noise that is generated by discrete gain changing in said first programmable gain amplifier because of their DC offset.

5. A wireless communication receiver according to claim 1, wherein said received signals are formatted in a predetermined frame structure and received without intermittence and said timing control circuit exerts control so that said programmable gain amplifier make gain change at timing when a specific signal that is strong to noise impact by being error corrected in said frame structure is received.

6. A wireless communication receiver according to claim 1, wherein said received signals are formatted in a predetermined frame structure and received without intermittence and said timing control circuit exerts control so that said programmable gain amplifier make gain change at random timing of receiving signal within said frame structure to reduce probability of changing gain during receiving weak signal to noise impact.

7. A wireless communication receiver according to claim 1, wherein said received signals are formatted in a predetermined frame structure and received without intermittence and said timing control circuit includes a device for measuring time in synchronization with said frame structure and a device for storing said frame structure and exerts control so that the programmable gain amplifier make gain change out of timing when a specific signal that is strong to noise impact by being error corrected in the frame is received to reduce the noise that is generated by discrete gain changing in said first programmable gain amplifier because of their DC offsets.

8. A wireless communication receiver according to claim 1, wherein said received signals are formatted in a predetermined frame structure and received without intermittence and said timing control circuit exerts control so that the frequency of gain change by said first programmable gain amplifier that is connected to mixer at the following stage is reduced by providing said first programmable gain amplifier with a hysteresis characteristic.

9. A wireless communication receiver including a first mixer for converting received signals to a predetermined baseband frequency by downconverting the signals once and a plurality of stages of programmable gain amplifiers which are connected in series to the first mixer at the following stage, have a gain adjustment function that enables gain change in discrete gains, and include first and second transistors which form a differential pair, wherein a first-stage programmable gain amplifier out of said plurality of stages of programmable gain amplifiers has a structure in which a plurality of first resistors connected in series to a plurality of first switches connected in parallel to the emitter of said first transistor are connected to one end of a capacitor and a plurality of second resistors connected in series to a plurality of second switches connected in parallel to the emitter of said second transistor are connected to the other end of said capacitor and at least one programmable gain amplifier except the first-stage and the last-stage ones has a structure in which the emitter of said first transistor and the emitter of said second transistor, both transistors forming a differential pair, are connected via a plurality of resistors which are connected in parallel and switches which are respectively connected in series to the plurality of resistors.

10. A wireless communication receiver comprising:
a first mixer for converting received signals to a predetermined baseband frequency by down converting the signals once; and
a first programmable gain amplifier, which is connected in series to the first mixer at the following stage, and has a gain adjustment function that enables gain change in discrete gains,
wherein said wireless communication receiver includes a circuit for reducing noise that is generated by discrete gain changing in said first programmable gain amplifier because of their DC offsets,
wherein said circuit for reducing noise is a timing control circuit which controls gain change timing for reducing noise that is generated by discrete gain changing in said first programmable gain amplifier because of their DC offsets, and
wherein said received signals are formatted in a predetermined frame structure and received without intermittence and said timing control circuit exerts control so that said programmable gain amplifier make gain change at timing when a specific signal that is strong to noise impact by being error corrected in said frame structure is received.

11. A wireless communication receiver comprising:
a first mixer for converting received signals to a predetermined baseband frequency by down converting the signals once; and
a first programmable gain amplifier, which is connected in series to the first mixer at the following stage, and has a gain adjustment function that enables gain change in discrete gains,
wherein said wireless communication receiver includes a circuit for reducing noise that is generated by discrete gain changing in said first programmable gain amplifier because of their DC offsets,
wherein said circuit for reducing noise is a timing control circuit which controls gain change timing for reducing noise that is generated by discrete gain changing in said first programmable gain amplifier because of their DC offsets, and
wherein said received signals are formatted in a predetermined frame structure and received without intermittence and said timing control circuit exerts control so that said programmable gain amplifier make gain change at random timing of receiving signal within said frame structure to reduce probability of changing gain during receiving weak signal to noise impact.

12. A wireless communication receiver comprising:
a first mixer for converting received signals to a predetermined baseband frequency by down converting the signals once; and
a first programmable gain amplifier, which is connected in series to the first mixer at the following stage, and has a gain adjustment function that enables gain change in discrete gains,
wherein said wireless communication receiver includes a circuit for reducing noise that is generated by discrete gain changing in said first programmable gain amplifier because of their DC offsets,
wherein said circuit for reducing noise is a timing control circuit which controls gain change timing for reducing noise that is generated by discrete gain changing in said first programmable gain amplifier because of their DC offsets, and
wherein said received signals are formatted in a predetermined frame structure and received without intermittence and said timing control circuit includes a device for measuring time in synchronization with said frame structure and a device for storing said frame structure and exerts control so that the programmable gain amplifier make gain change out of timing when a specific signal that is strong to noise impact by being error corrected in the frame is received to reduce the noise that is generated by discrete gain changing in said first programmable gain amplifier because of their DC offsets.

* * * * *